(12) United States Patent
Nakayama et al.

(10) Patent No.: US 12,527,148 B2
(45) Date of Patent: Jan. 13, 2026

(54) DETECTOR HAVING AN ELEMENT PORTION INCLUDING AN ORGANIC SEMICONDUCTOR LAYER AND A WIRING PORTION

(71) Applicant: KABUSHIKI KAISHA TOSHIBA, Tokyo (JP)

(72) Inventors: Kohei Nakayama, Kawasaki (JP); Fumihiko Aiga, Kawasaki (JP); Atsushi Wada, Kawasaki (JP); Yuko Nomura, Kawasaki (JP); Isao Takasu, Setagaya (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 777 days.

(21) Appl. No.: 17/820,937

(22) Filed: Aug. 19, 2022

(65) Prior Publication Data

US 2023/0292535 A1    Sep. 14, 2023

(30) Foreign Application Priority Data

Mar. 9, 2022    (JP) .................................. 2022-035794

(51) Int. Cl.
  *H10K 30/81*    (2023.01)
  *G01T 1/20*    (2006.01)
  (Continued)

(52) U.S. Cl.
  CPC .............. *H10K 30/81* (2023.02); *G01T 1/20* (2013.01); *G01T 1/208* (2013.01); *G01T 1/241* (2013.01); *H10K 30/80* (2023.02)

(58) Field of Classification Search
  CPC ......... G01T 1/20; G01T 1/2018; G01T 1/208; G01T 1/241; H01L 25/065;
  (Continued)

(56) References Cited

U.S. PATENT DOCUMENTS

| | | |
|---|---|---|
| 2014/0225094 A1 | 8/2014 | Fraboni et al. |
| 2019/0074321 A1* | 3/2019 | Na .................... H10F 39/80377 |
| 2019/0265370 A1 | 8/2019 | Nakayama et al. |

FOREIGN PATENT DOCUMENTS

| | | |
|---|---|---|
| JP | 2001-320039 A | 11/2001 |
| JP | 2013-45977 A | 3/2013 |

(Continued)

OTHER PUBLICATIONS

Japanese Office Action issued Oct. 30, 2024 in Japanese Application 2022-035794, (with unedited computer-generated English translation), citing document 15 therein, 6 pages.

*Primary Examiner* — Cheung Lee
(74) *Attorney, Agent, or Firm* — Oblon, McClelland, Maier & Neustadt, L.L.P.

(57) ABSTRACT

According to one embodiment, a detector includes an element portion. The element portion includes a first detection portion and a wiring portion. The first detection portion includes a first electrode, a first counter electrode, and a first organic semiconductor layer. At least a part of the first organic semiconductor layer is between the first electrode and the first counter electrode. The wiring part includes a first electrode layer electrically connected with the first electrode, a first counter electrode layer electrically connected with the first counter electrode, and a first conductive layer. The first counter electrode layer is between the first electrode layer and the first detection portion in a first direction from the first electrode layer to the first counter electrode layer. The first conductive layer is between the first electrode layer and the first counter electrode layer in the first direction.

20 Claims, 22 Drawing Sheets

(51) Int. Cl.
    *G01T 1/208*     (2006.01)
    *G01T 1/24*     (2006.01)
    *H10K 30/80*     (2023.01)

(58) Field of Classification Search
    CPC ............. H01L 25/0652; H01L 25/0655; H01L 25/0657; H01L 25/16; H01L 25/162; H01L 25/165; H01L 25/167; H01L 25/18; H10K 30/30; H10K 30/50; H10K 30/53; H10K 30/80; H10K 30/81; H10K 39/10; H10K 39/12; H10K 39/15; H10K 39/18; H10K 39/601; H10K 39/621
    See application file for complete search history.

(56) References Cited

FOREIGN PATENT DOCUMENTS

| | | | |
|---|---|---|---|
| JP | 2014-529728 | A | 11/2014 |
| JP | 2019-145751 | A | 8/2019 |
| WO | WO 2013/017915 | A1 | 2/2013 |

* cited by examiner

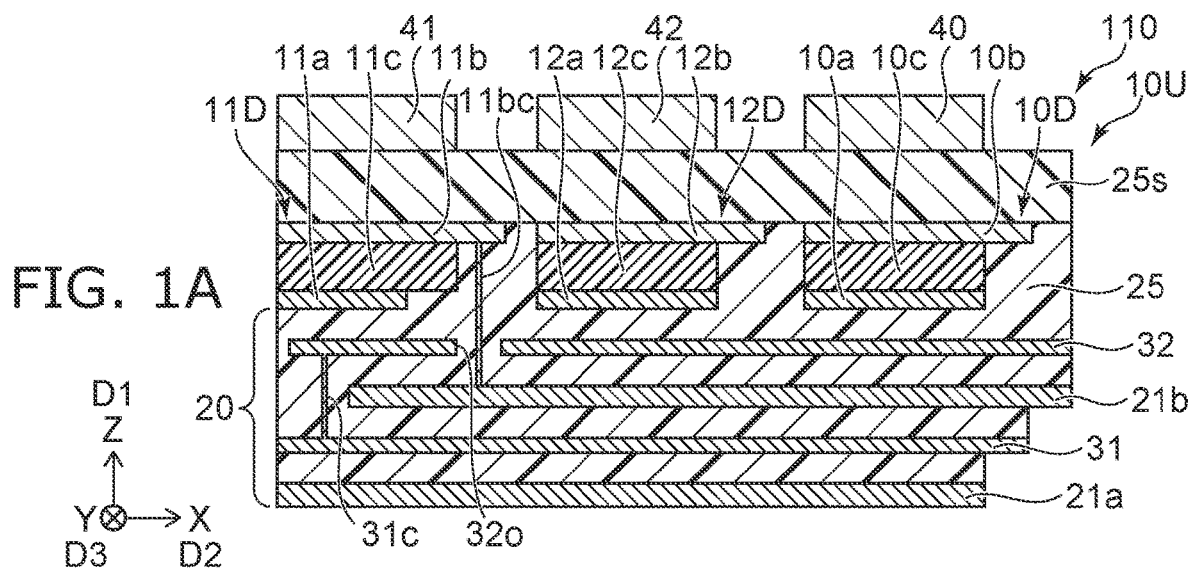
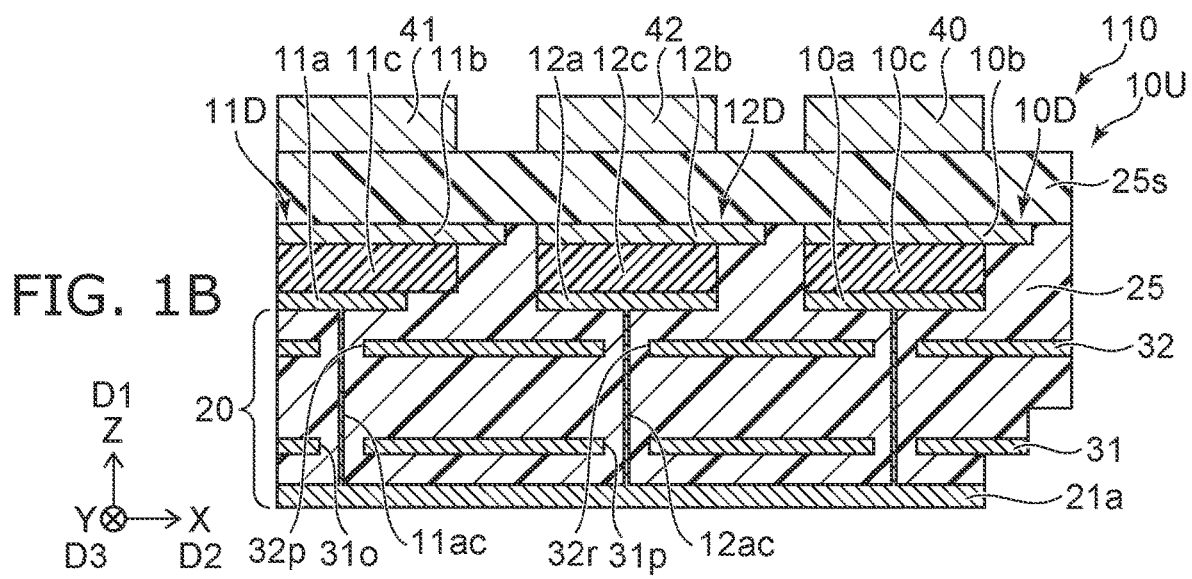
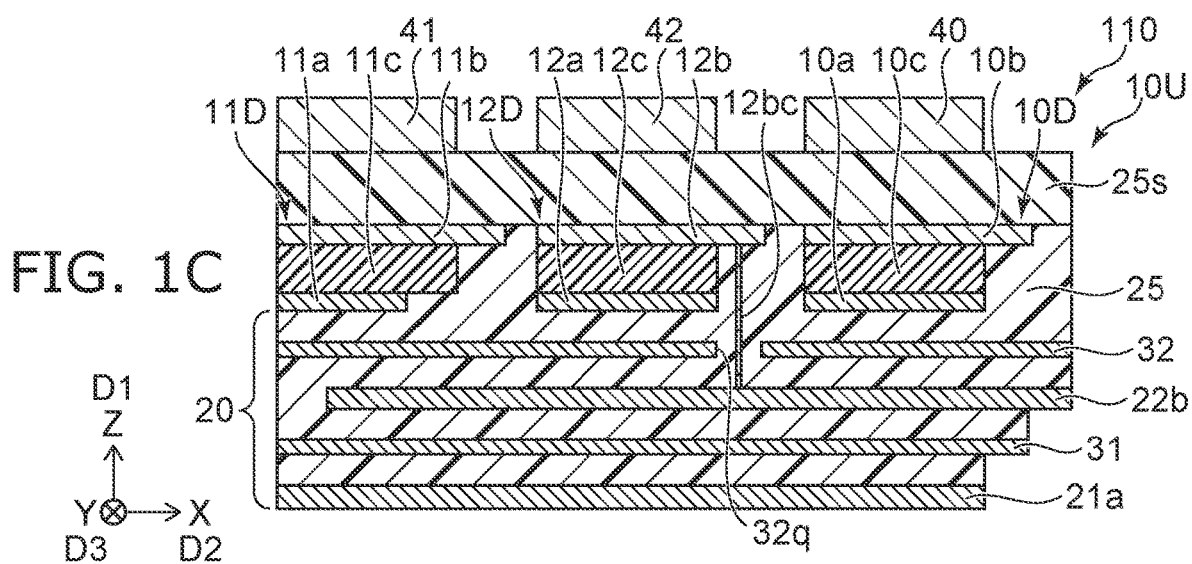

DETECTOR HAVING AN ELEMENT PORTION INCLUDING AN ORGANIC SEMICONDUCTOR LAYER AND A WIRING PORTION

CROSS-REFERENCE TO RELATED APPLICATIONS

This application is based upon and claims the benefit of priority from Japanese Patent Application No. 2022-035794, filed on Mar. 9, 2022; the entire contents of which are incorporated herein by reference.

FIELD

Embodiments of the invention generally relate to a detector.

BACKGROUND

Stable detection is desired in the detector.

BRIEF DESCRIPTION OF THE DRAWINGS

FIGS. 1A to 1C are schematic cross-sectional views illustrating a detector according to the first embodiment;

DETAILED DESCRIPTION

Figure 2:
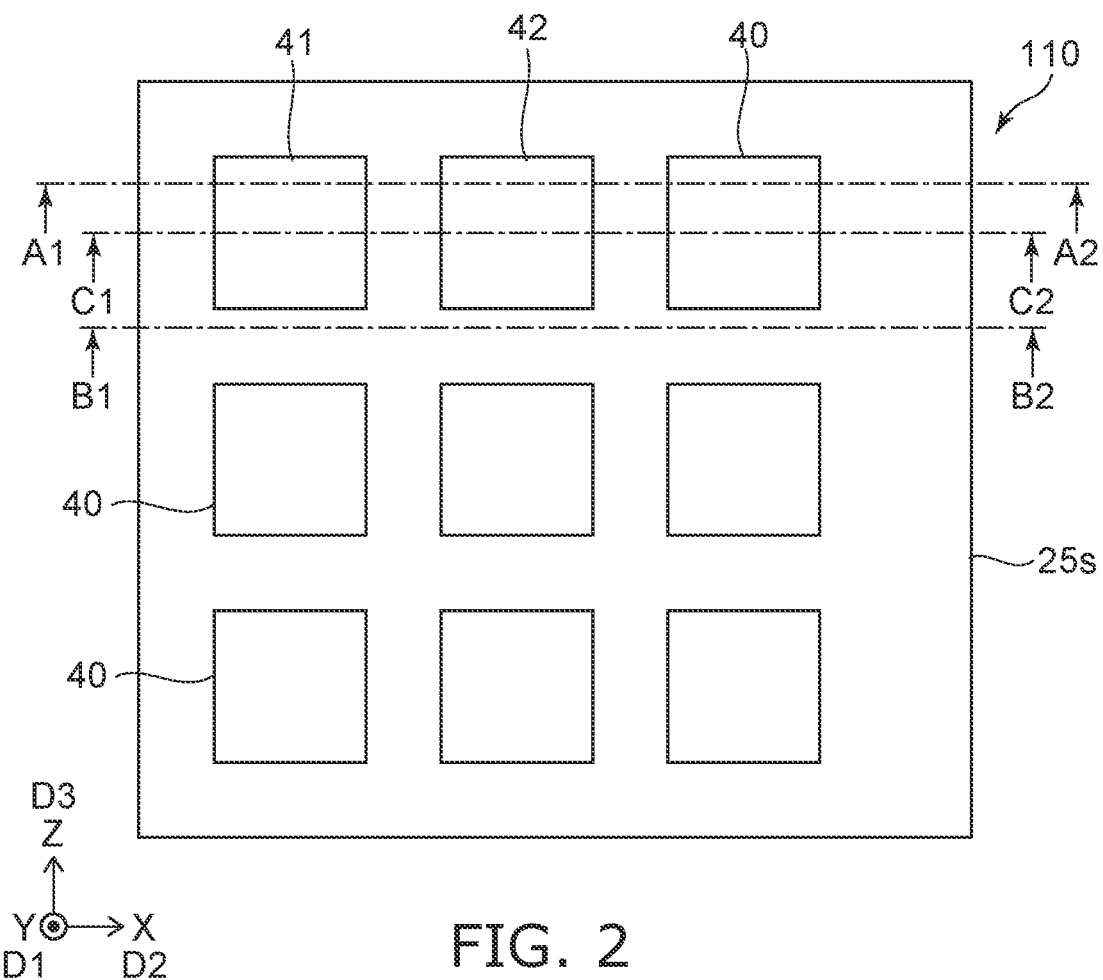
FIG. 2 is a schematic plan view illustrating the detector according to the first embodiment.
Figure 3:
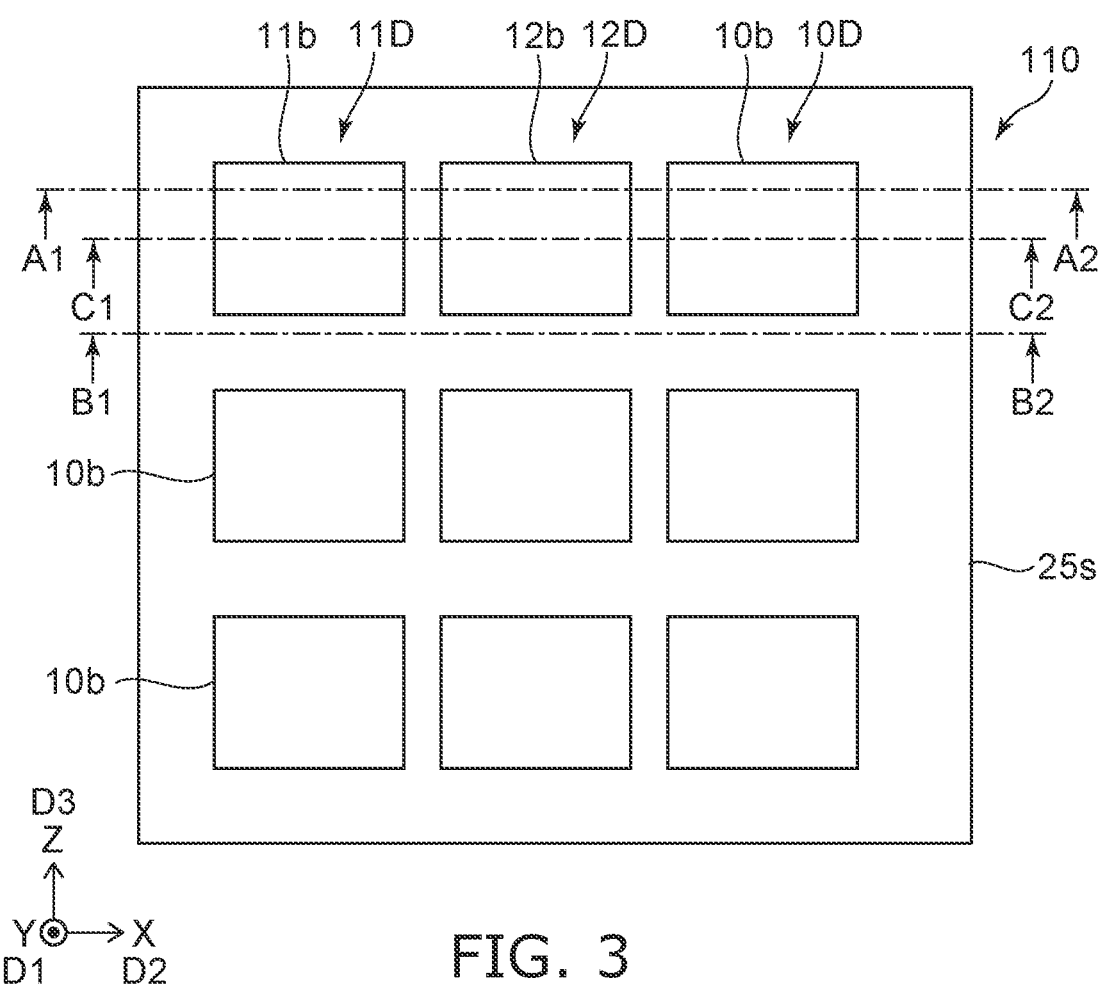
FIG. 3 is a schematic plan view illustrating the detector according to the first embodiment.
Figure 4:
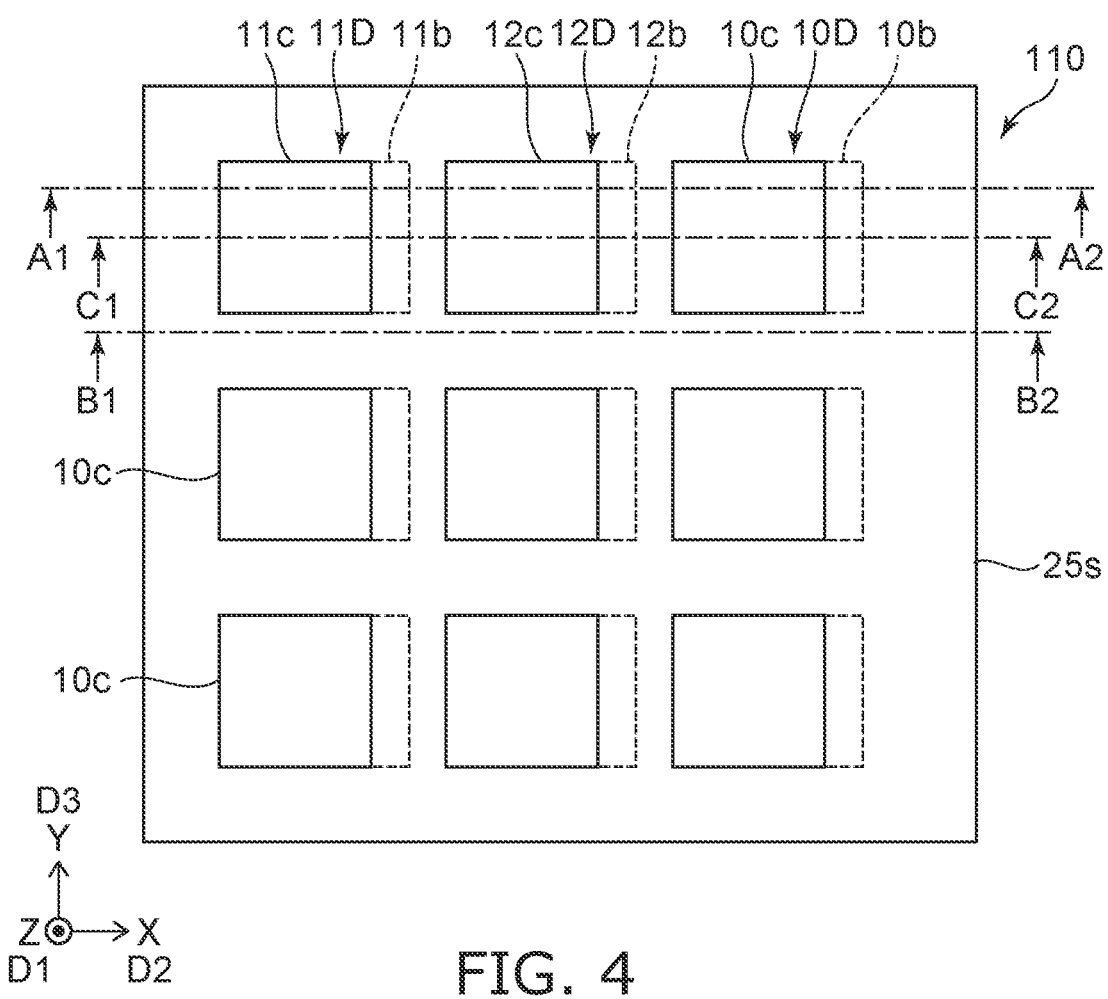
FIG. 4 is a schematic plan view illustrating the detector according to the first embodiment.
Figure 5:
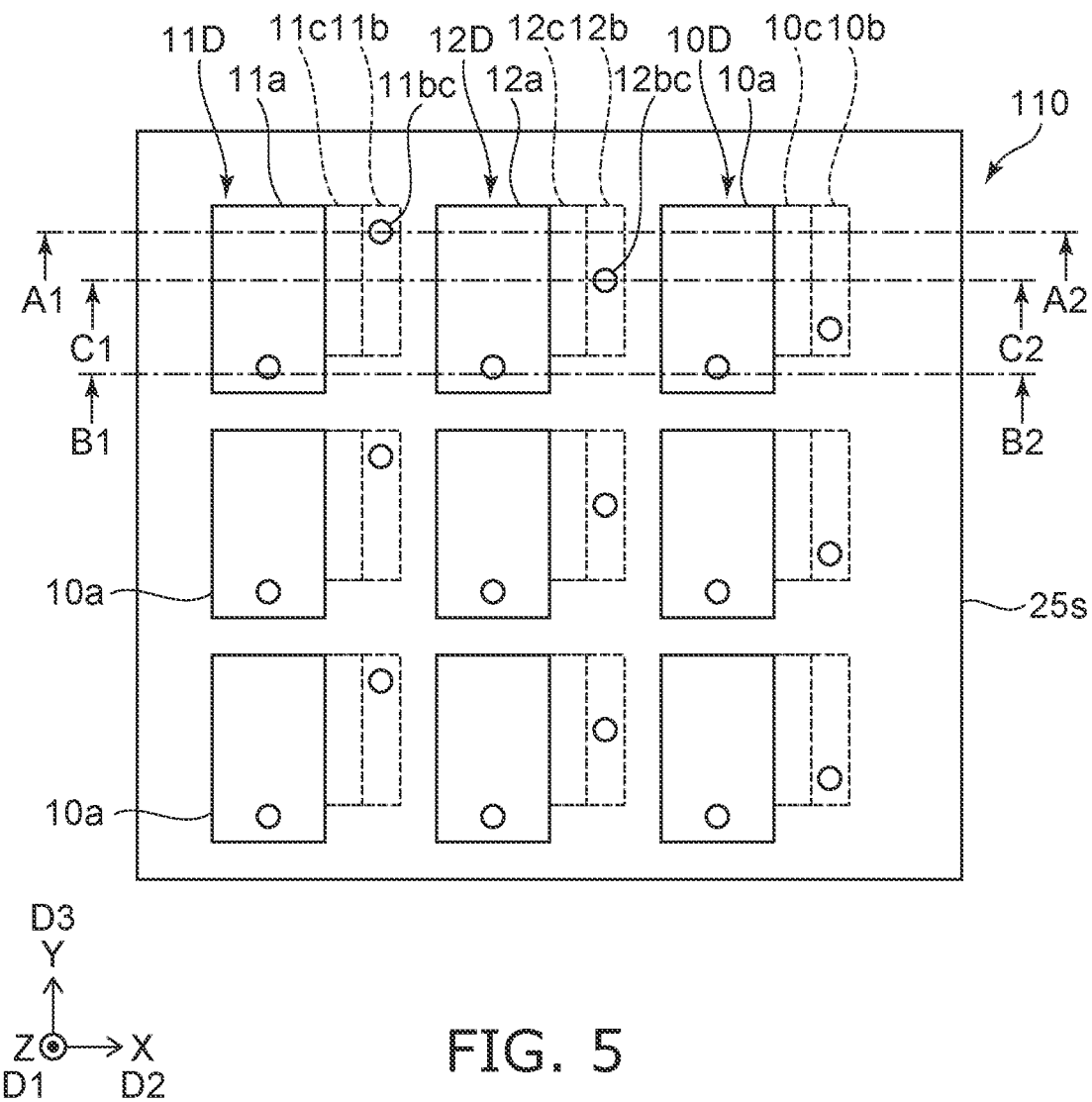
FIG. 5 is a schematic plan view illustrating the detector according to the first embodiment.

According to one embodiment, a detector includes an element portion. The element portion includes a first detection portion and a wiring portion. The first detection portion includes a first electrode, a first counter electrode, and a first organic semiconductor layer. At least a part of the first organic semiconductor layer is between the first electrode and the first counter electrode. The wiring part includes a first electrode layer electrically connected with the first electrode, a first counter electrode layer electrically connected with the first counter electrode, and a first conductive layer. The first counter electrode layer is between the first electrode layer and the first detection portion in a first direction from the first electrode layer to the first counter electrode layer. The first conductive layer is between the first electrode layer and the first counter electrode layer in the first direction.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously in an antecedent drawing are marked with like reference numerals, and a detailed description is omitted as appropriate.

First Embodiment

FIGS. 1A to 1C are schematic cross-sectional views illustrating a detector according to the first embodiment.

FIGS. 2 to 9 are schematic plan views illustrating the detector according to the first embodiment.

Figure 10:
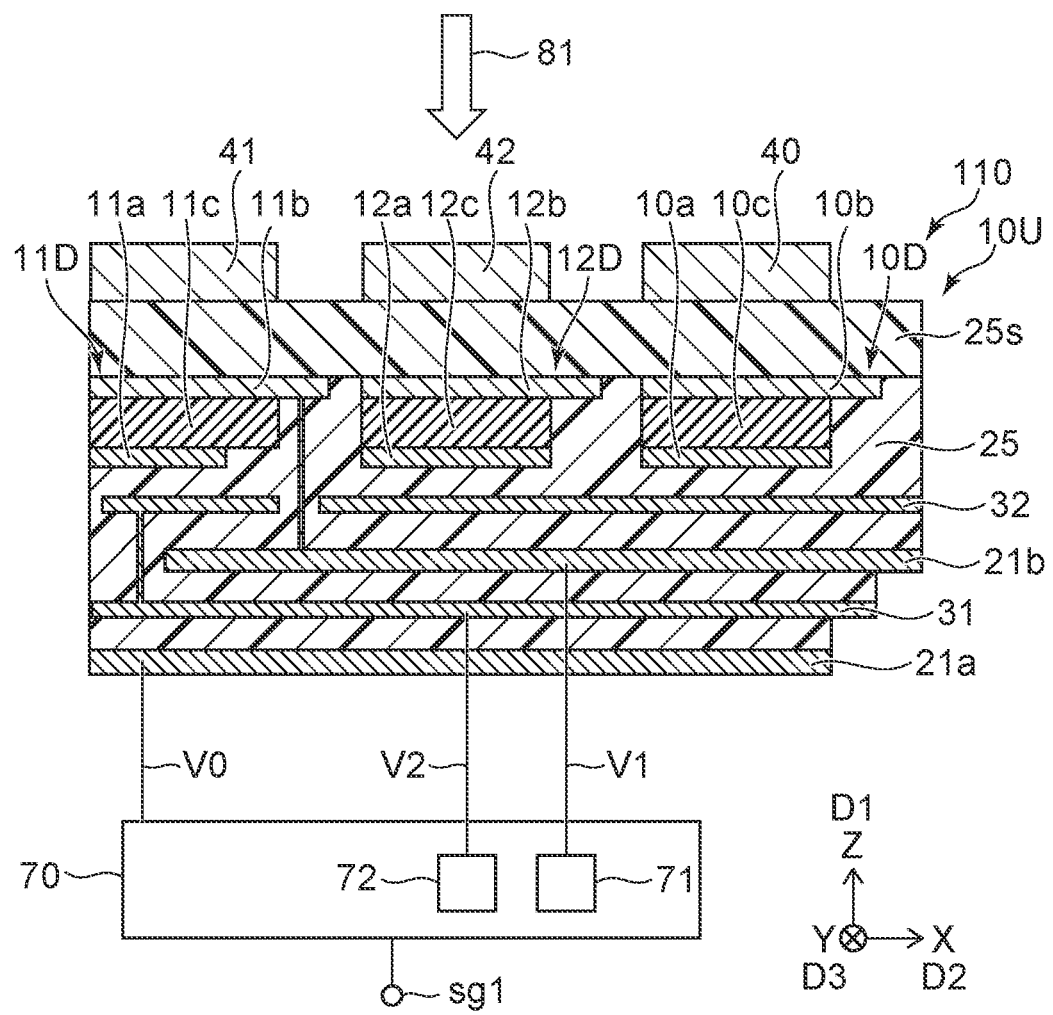
FIG. 10 is a schematic cross-sectional view illustrating the detector according to the first embodiment.

FIG. 10 is a schematic cross-sectional view illustrating the detector according to the first embodiment.

FIG. 1A is a cross-sectional view taken along the line A1-A2 of FIGS. 2 to 9. FIG. 1B is a cross-sectional view taken along the line B1-B2 of FIGS. 2 to 9. FIG. 1C is a cross-sectional view taken along the line C1-C2 of FIGS. 2 to 9.

As shown in FIG. 1A, a detector 110 according to the embodiment includes an element portion 10U. The element portion 10U includes a first detection portion 11D and a wiring portion 20. The first detection portion 11D includes a first electrode 11a, a first counter electrode 11b, and a first organic semiconductor layer 11c. At least a part of the first organic semiconductor layer 11c is provided between the first electrode 11a and the first counter electrode 11b.

The wiring portion 20 includes a first electrode layer 21a, a first counter electrode layer 21b, and a first conductive layer 31.

As shown in FIG. 1B, the first electrode layer 21a is electrically connected with the first electrode 11a. For example, the first electrode 11a is electrically connected with the first electrode layer 21a by a first electrode connecting portion 11ac. The first electrode layer 21a functions as a wiring layer for the first electrode 11a.

As shown in FIG. 1A, the first counter electrode layer 21b is electrically connected with the first counter electrode 11b. For example, the first counter electrode 11b is electrically connected with the first counter electrode layer 21b by a first counter electrode connecting portion 11bc. The first counter electrode layer 21b functions as a wiring layer for the first counter electrode 11b.

A first direction D1 from the first electrode layer 21a to the first counter electrode layer 21b is a Z-axis direction. One direction perpendicular to the Z-axis direction is defined as an X-axis direction. The direction perpendicular to the Z-axis direction and the X-axis direction is defined as the Y-axis direction.

The first electrode layer 21a, the first counter electrode layer 21b, and the first conductive layer 31 are substantially parallel to the XY plane.

In the first direction D1, the first counter electrode layer 21b is located between the first electrode layer 21a and the first detection portion 11D. In the first direction D1, the first conductive layer 31 is located between the first electrode layer 21a and the first counter electrode layer 21b.

The first conductive layer 31 is electrically insulated from the first electrode layer 21a. The first conductive layer 31 is electrically insulated from the first counter electrode layer 21b. As shown in FIG. 1A, the wiring portion 20 may include an insulating member 25. At least a part of the insulating member 25 is provided between the first electrode layer 21a and the first conductive layer 31, between the first conductive layer 31 and the first counter electrode layer 21b, and between the first counter electrode layer 21b and the element portion 10U.

As shown in FIG. 10, a detection target wave 81 is incident on the element portion 10U. The detection target wave 81 is, for example, an electromagnetic wave or radiation. In this example, the element portion 10U includes a first scintillator 41. In this case, the detection target wave 81 is radiation. Radiation is incident on the first scintillator 41. In the first scintillator 41, light corresponding to the radiation is generated. The light is incident on the first detection portion 11D. In the first organic semiconductor layer 11c, an electric charge corresponding to light is generated. By applying a bias voltage between the first electrode 11a and the first counter electrode 11b, the electric charge can be detected as an electric signal. The detector 110 is, for example, a radiation detector. In the embodiment, the detection target wave 81 may be light. In this case, the first scintillator 41 may be omitted. The first organic semiconductor layer 11c functions as a photoelectric conversion layer.

As shown in FIG. 10, the detector 110 may include a controller 70. The controller 70 can set the first counter electrode layer 21b to a first potential V1. The first potential V1 is a potential with reference to a potential V0 of the first electrode layer 21a. The potential of the first electrode 11a becomes the potential V0 of the first electrode layer 21a. The potential of the first counter electrode 11b becomes the first potential V1 of the first counter electrode layer 21b. The first potential V1 corresponds to the bias voltage. As described above, when the bias voltage is applied, the signal sg1 corresponding to the incident detection target wave 81 is output from the controller 70.

The controller 70 can set the first conductive layer 31 to the second potential V2. The second potential V2 is a potential with reference to the potential V0 of the first electrode layer 21a. For example, the second potential V2 may be the same as the first potential V1. Alternatively, the second potential V2 may be between the potential V0 of the first electrode layer 21a and the first potential V1.

Thus, in the embodiment, the first conductive layer 31 that can be set to the second potential V2 is provided between the first electrode layer 21a and the first counter electrode layer 21b. The first conductive layer 31 functions as a shield for the first counter electrode layer 21b. Thereby, for example, fluctuation of the potential of the conductive member due to the influence of capacitive coupling or inductive coupling can be suppressed.

In one example, when the detection target wave 81 is incident on the first detection portion 11D, the potential of the first counter electrode layer 21b electrically connected with the first counter electrode 11b fluctuates transiently. In a reference example in which the first conductive layer 31 is not provided, this fluctuation in potential may affect the potential of other conductive members. For example, the potential of the first electrode layer 21a may fluctuate due to the transient fluctuation of the potential of the first counter electrode layer 21b. This causes noise. Due to the transient fluctuation of the potential of the first counter electrode layer 21b, the potential of the wiring layer corresponding to the other detection portion may fluctuate. In the reference example, stable detection is difficult due to noise.

On the other hand, in the embodiment, the first conductive layer 31 is provided. The first conductive layer 31 functions as a shield. As a result, noise can be suppressed. Stable detection is easily performed. According to the embodiment, it is possible to provide a detector capable of stable detection.

For example, as the number of detection elements (pixels) in the detector increases, the wiring becomes longer and the wiring capacitance increases. As a result, noise tends to increase. In the embodiment, even when the number of pixels is increased, it is easy to detect with suppressed noise.

For example, if the wiring capacitance increases and the noise increases, the operation of the preamplifier becomes unstable and oscillation is likely to occur. By providing the first conductive layer 31 that functions as a shield, the operation of the preamplifier becomes stable and oscillation is suppressed.

As shown in FIG. 10, the controller 70 may include a first circuit 71 and a second circuit 72. The first circuit 71 can set the first counter electrode layer 21b to be the first potential V1. The second circuit 72 can set the first conductive layer 31 to be the second potential V2.

In the embodiment, the potential V0 is, for example, a ground potential. The first potential V1 and the second potential V2 are negative. In one example, the first potential V1 and the second potential V2 are −10 V.

As shown in FIG. 1A, in this example, the wiring portion 20 includes a second conductive layer 32. The second conductive layer 32 is electrically connected with the first conductive layer 31. In the first direction D1, at least a part of the second conductive layer 32 is provided between at least a part of the first counter electrode layer 21b and the first detection portion 11D.

As shown in FIG. 1A, the wiring portion 20 includes a first conductive layer connecting portion 31c. The first conductive layer connecting portion 31c electrically connects the second conductive layer 32 with the first conductive layer 31. The potential of the second conductive layer 32 is the second potential V2. The second conductive layer 32 functions as a shield. A first counter electrode layer 21b is provided between the first conductive layer 31 and the second conductive layer 32 that function as a shield. The influence caused by the fluctuation of the potential of the first counter electrode layer 21b is suppressed more effectively.

As shown in FIG. 1A, the wiring portion 20 includes a first counter electrode connecting portion 11bc. The second conductive layer 32 includes a second conductive layer hole 32o. The first counter electrode connecting portion 11bc passes through the second conductive layer hole 32o in the first direction D1. The first counter electrode connecting portion 11bc electrically connects the first counter electrode 11b with the first counter electrode layer 21b.

As shown in FIG. 1B, the wiring portion 20 includes a first electrode connecting portion 11ac. The first conductive layer 31 includes a first conductive layer hole 310. The first electrode connecting portion 11ac passes through the first conductive layer hole 310 in the first direction D1. The first electrode connecting portion 11ac electrically connects the first electrode 11a with the first electrode layer 21a.

As shown in FIG. 1B, the second conductive layer 32 includes another second conductive layer hole 32p. The first electrode connecting portion 11ac passes through the second conductive layer hole 32p in the first direction D1.

As shown in FIG. 1A, the element portion 10U includes a first scintillator 41. The first detection portion 11D is located between the wiring portion 20 and the first scintillator 41. The element portion 10U includes a second scintillator 42. The second detection portion 12D is located between the wiring portion 20 and the second scintillator 42. As described above, the element portion 10U may include a plurality of scintillators 40. One of the plurality of detection portions 10D is located between the wiring portion 20 and one of the plurality of scintillators 40.

As shown in FIG. 1A, in the detector 110, a direction from the first electrode 11a to the first counter electrode 11b is along the first direction D1. For example, in the first direction D1, the first electrode 11a is located between the wiring portion 20 and the first counter electrode 11b. The first electrode 11a is located between the first conductive layer 31 and the first counter electrode 11b in the first direction D1.

In this example, as shown in FIG. 10, the detection target wave 81 (or the light from the first scintillator 41) passes through the first counter electrode 11b and is incident on the first organic semiconductor layer 11c. The first counter electrode 11b is light transmissive. For example, the light transmittance of the first counter electrode 11b is higher than the light transmittance of the first electrode 11a.

For example, the first electrode 11a includes at least one selected from the group consisting of Al, Be, Mg, Zn and C. For example, the first counter electrode 11b includes a compound including a first element and oxygen. The first element includes at least one selected from the group consisting of In and Zn. The first counter electrode 11b includes, for example, indium oxide, ITO, or the like.

As shown in FIGS. 1A to 1C and FIGS. 3 to 5, the element portion 10U may include a plurality of detection portions 10D. The first detection portion 11D is one of a plurality of detection portions 10D. One of the plurality of detection portions 10D includes an electrode 10a, a counter electrode 10b, and an organic semiconductor layer 10c. At least a part of the organic semiconductor layer 10c is provided between the electrode 10a and the counter electrode 10b.

As shown in FIGS. 1A to 1C, for example, the plurality of detection portions 10D include a second detection portion 12D. The second detection portion 12D includes a second electrode 12a, a second counter electrode 12b, and a second organic semiconductor layer 12c. At least a part of the second organic semiconductor layer 12c is provided between the second electrode 12a and the second counter electrode 12b.

As shown in FIG. 1C, the wiring portion 20 includes a second counter electrode layer 22b. The second counter electrode layer 22b is electrically connected with the second counter electrode 12b. The second electrode 12a is electrically connected with the first electrode layer 21a (see FIG. 1B). As shown in FIG. 1C, in the first direction D1, a part of the first conductive layer 31 is located between the first electrode layer 21a and the second counter electrode layer 22b. In the first direction D1, the second counter electrode layer 22b is located between a part of the first conductive layer 31 and the second detection portion 12D. A second counter electrode connecting portion 12bc electrically connects the second counter electrode 12b with the second counter electrode layer 22b. The second counter electrode connecting portion 12bc passes through the second conductive layer hole 32p provided in the second conductive layer 32.

As shown in FIG. 1B, for example, the second electrode 12a is electrically connected with the first electrode layer 21a by a second electrode connecting portion 12ac. The second electrode connecting portion 12ac passes through another second conductive layer hole 32r provided in the second conductive layer 32 in the first direction D1.

Figure 7:
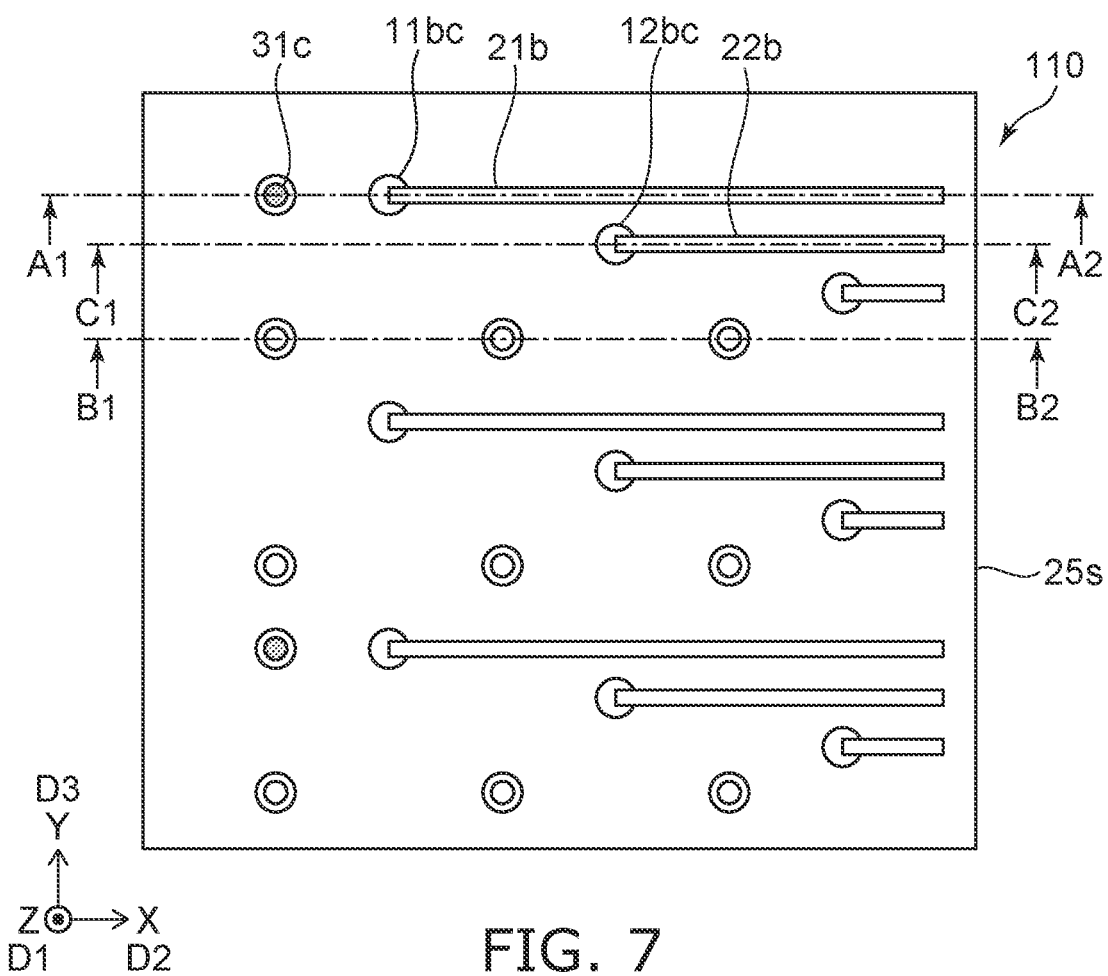
FIG. 7 is a schematic plan view illustrating the detector according to the first embodiment.

As shown in FIG. 7, the first counter electrode layer 21b extends along a second direction D2. The second direction D2 crosses the first direction D1. In this example, the second direction D2 is the X-axis direction. The second counter electrode layer 22b extends along the second direction D2. A direction from the second counter electrode layer 22b to the first counter electrode layer 21b is along a third direction D3 crossing a plane including the first direction D1 and the second direction D2. The third direction D3 is, for example, the Y-axis direction.

Figure 8:
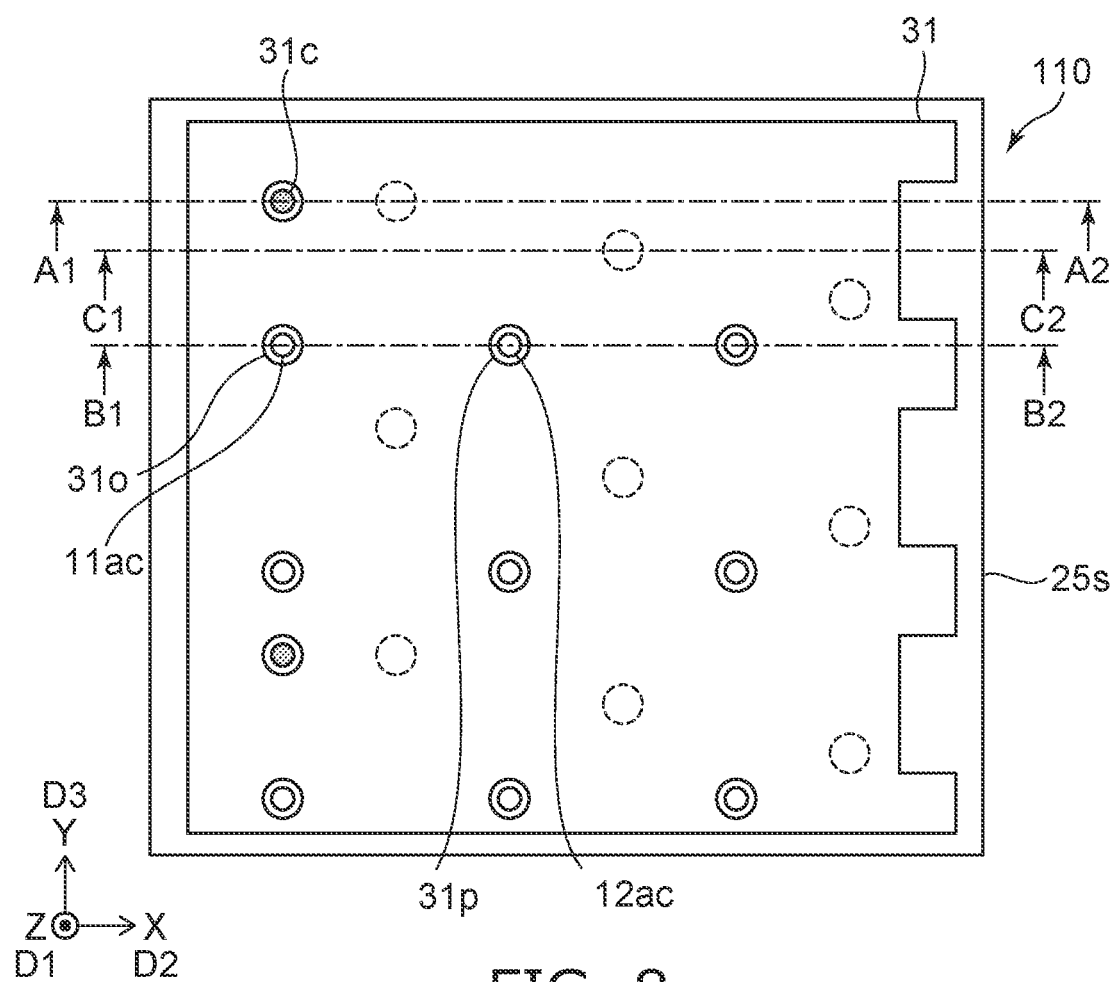
FIG. 8 is a schematic plan view illustrating the detector according to the first embodiment.
Figure 9:
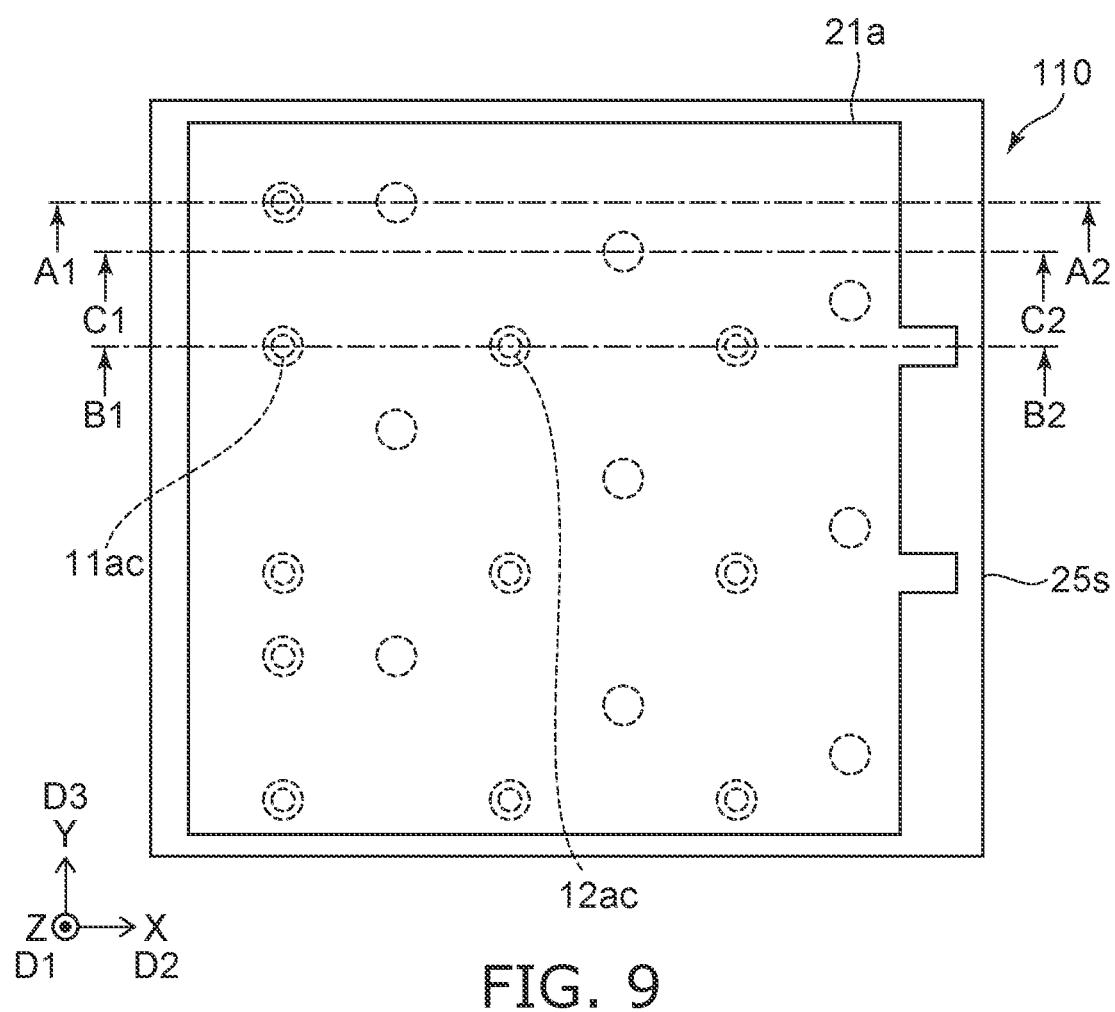
FIG. 9 is a schematic plan view illustrating the detector according to the first embodiment.

As shown in FIG. 7, the first counter electrode layer 21b and the second counter electrode layer 22b are line-shaped. The potentials of the plurality of counter electrodes are controlled by the plurality of the counter electrode layers being line-shaped. On the other hand, as shown in FIG. 8, the first conductive layer 31 is planar.

An area of the first conductive layer 31 is larger than an area of the first counter electrode layer 21b. The area of the first conductive layer 31 is the area of the first conductive layer 31 in a plane (X-Y plane) perpendicular to the first direction D1. The area of the first counter electrode layer 21b is the area of the first counter electrode layer 21b in the plane (X-Y plane) perpendicular to the first direction D1. As a result, the shielding effect of the first conductive layer 31 is more effectively exhibited. For example, the area of the first conductive layer 31 is 5 times or more the area of the first counter electrode layer 21b.

Figure 6:
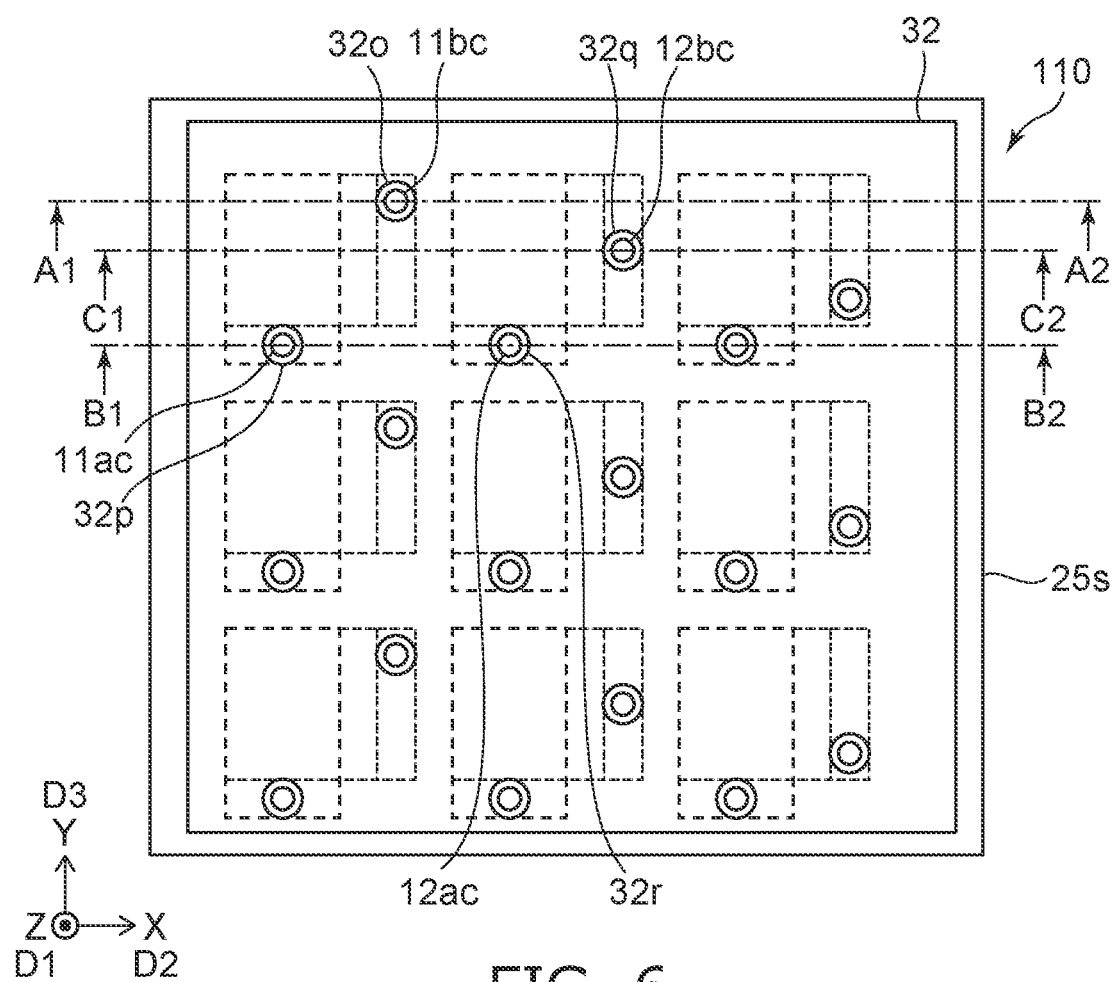
FIG. 6 is a schematic plan view illustrating the detector according to the first embodiment.

As shown in FIG. 6, the second conductive layer 32 is planar. An area of the second conductive layer 32 is larger than the area of the first counter electrode layer 21b. An area of the second conductive layer 32 is the area of the second conductive layer 32 in a plane (X-Y plane) perpendicular to the first direction D1. As a result, the shielding effect of the second conductive layer 32 is more effectively exhibited. For example, the area of the second conductive layer 32 is 5 times or more the area of the first counter electrode layer 21b.

The area of the first conductive layer 31 is larger than an area of the second counter electrode layer 22b. The area of the second conductive layer 32 is larger than the area of the second counter electrode layer 22b.

Figure 11:
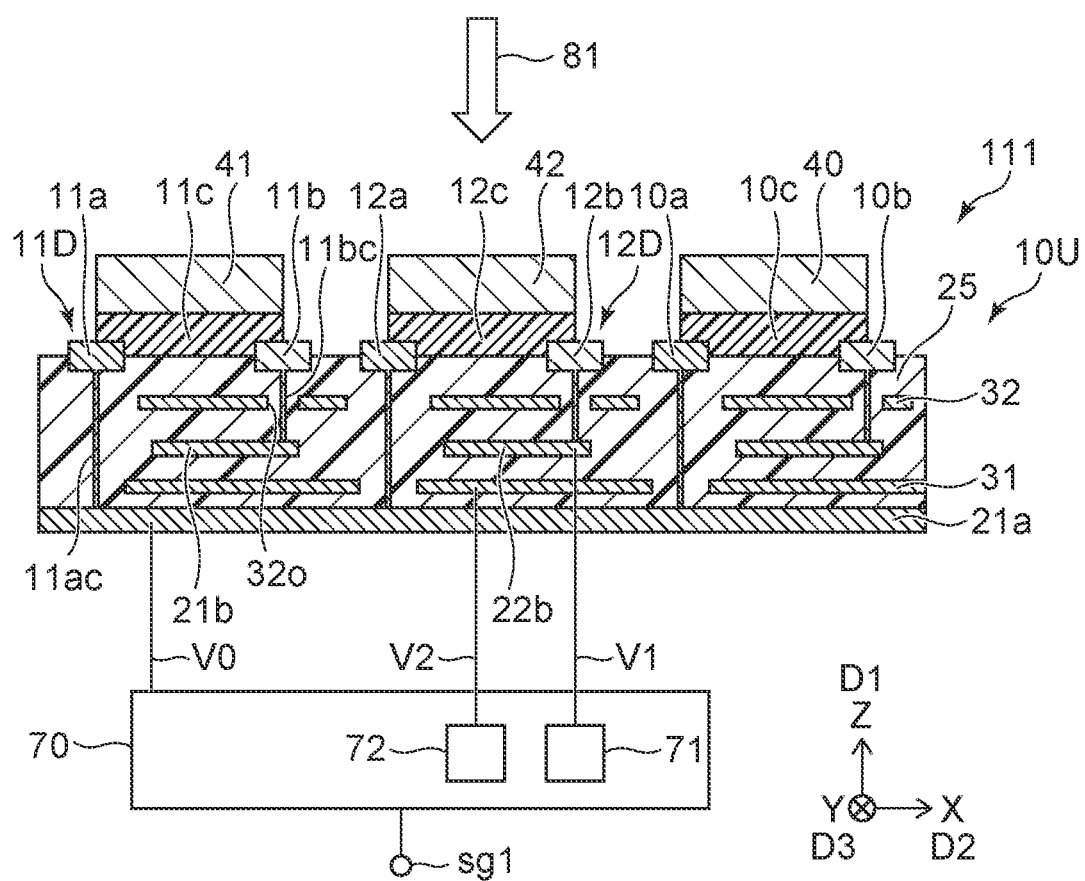
FIG. 11 is a schematic cross-sectional view illustrating the detector according to the first embodiment.

FIG. 11 is a schematic cross-sectional view illustrating the detector according to the first embodiment.

As shown in FIG. 11, in a detector 111 according to the embodiment, a direction from the first electrode 11a to the first counter electrode 11b crosses the first direction D1. Except for this, the configuration of the detector 111 may be the same as the configuration of the detector 110. Noise can also be suppressed in the detector 111. Stable detection becomes easy.

Figure 12A:
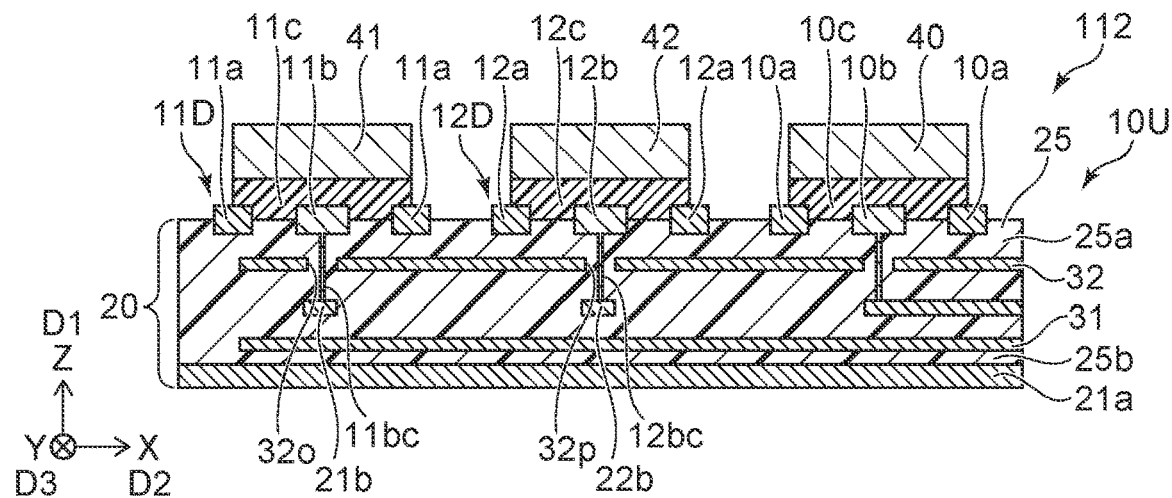
FIGS. 12A to 12C are schematic cross-sectional views illustrating the detector according to the first embodiment.
Figure 12B:
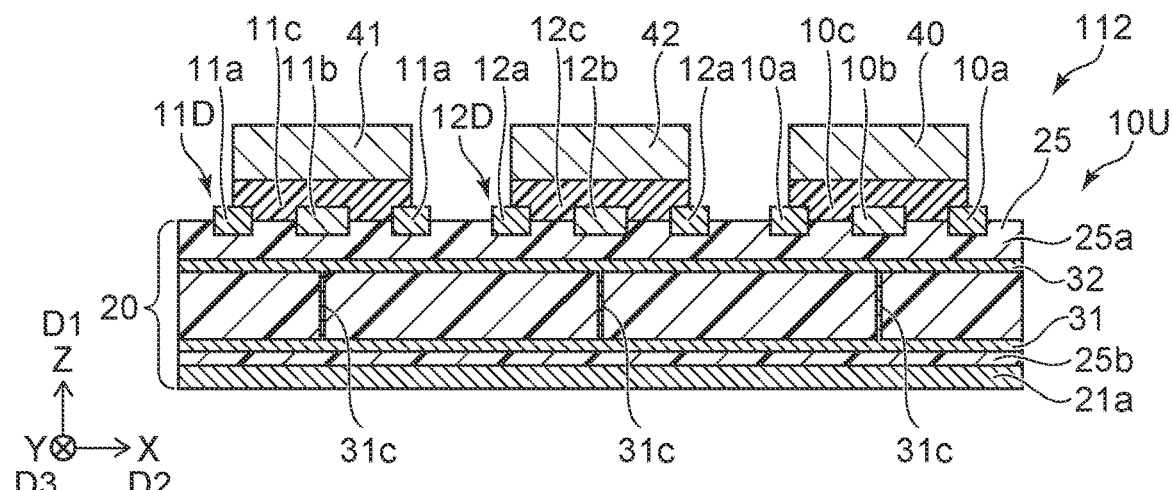
Figure 12C:
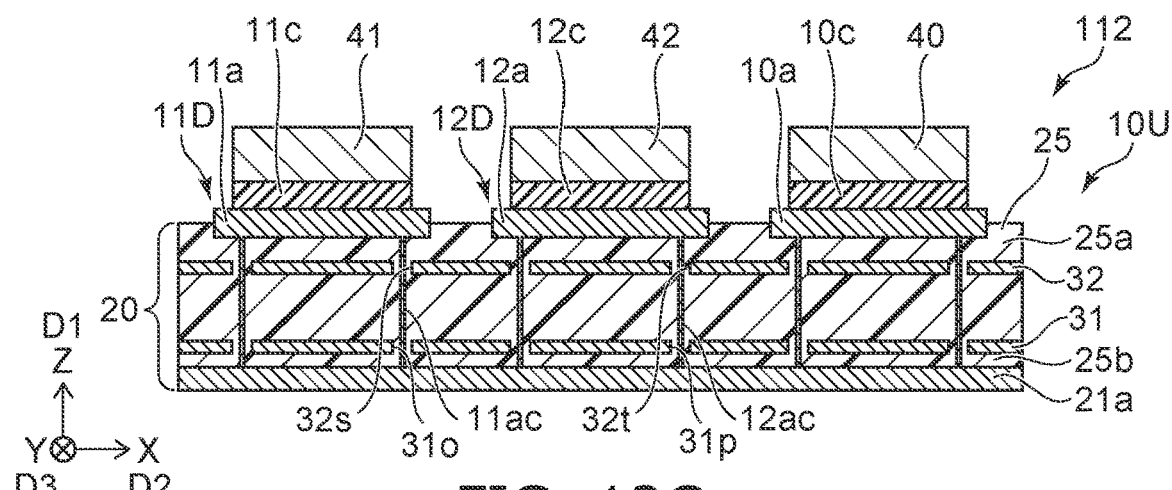
Figure 13:
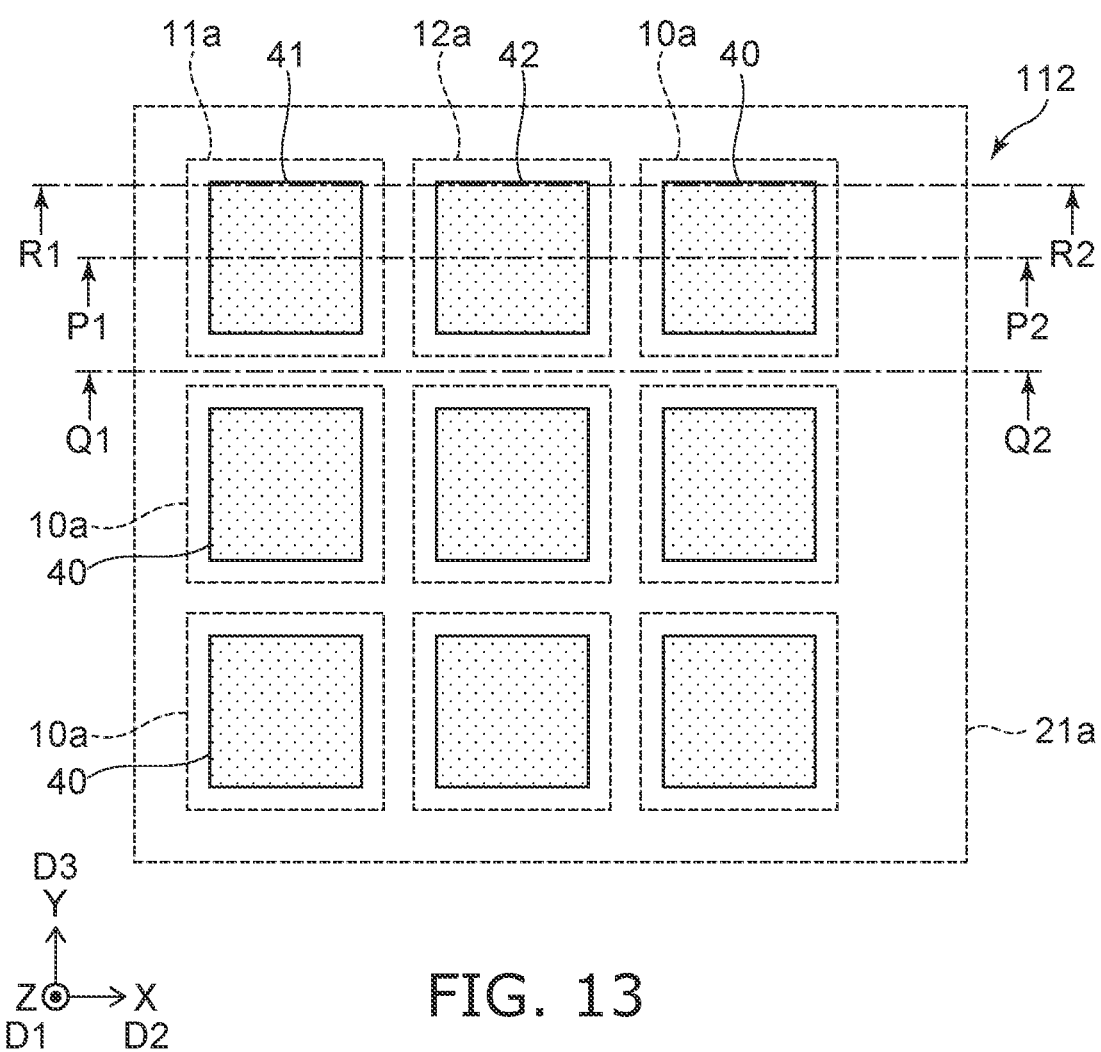
FIG. 13 is a schematic plan view illustrating the detector according to the first embodiment.
Figure 14:
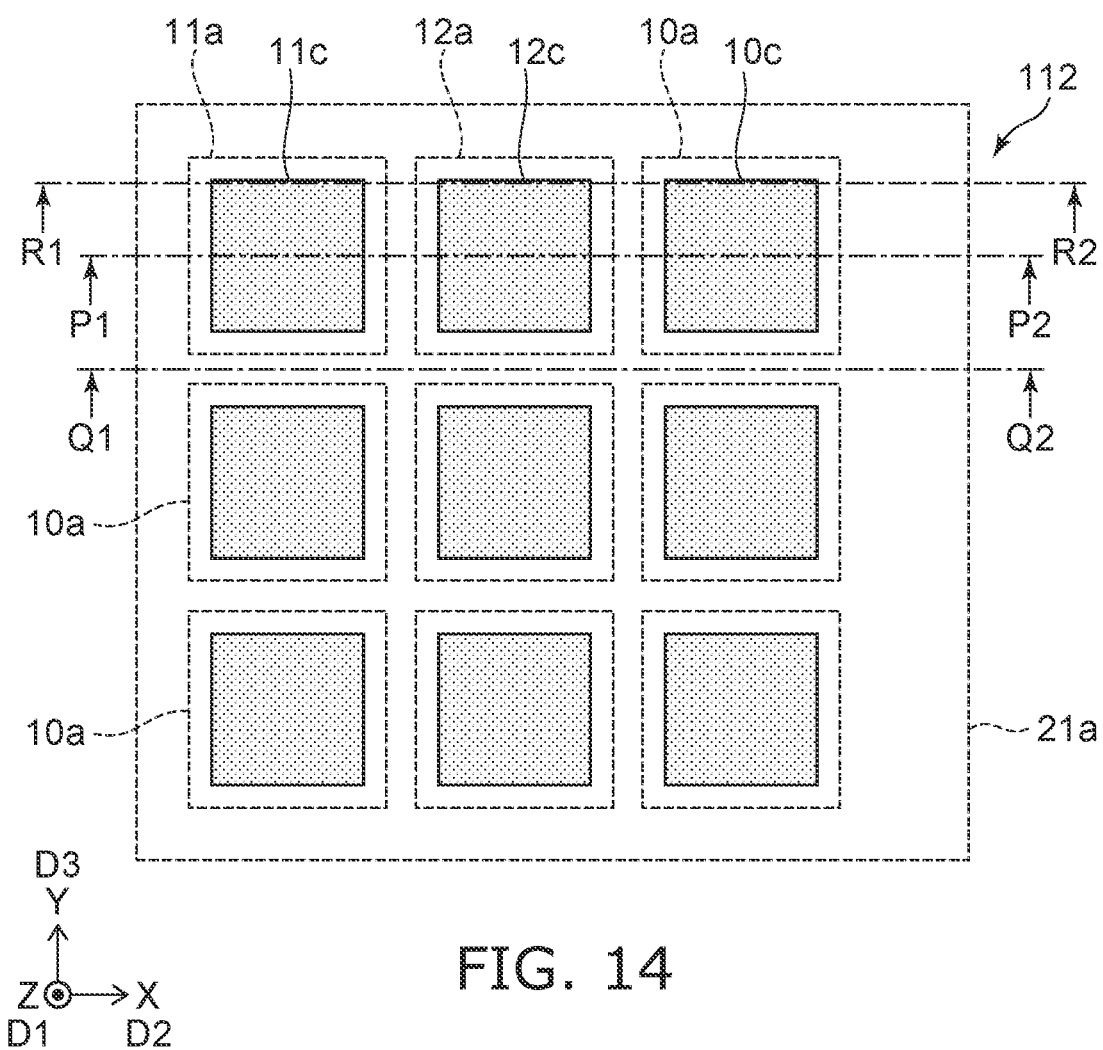
FIG. 14 is a schematic plan view illustrating the detector according to the first embodiment.

FIGS. 12A to 12C are schematic cross-sectional views illustrating the detector according to the first embodiment.

FIGS. 13 to 21 are schematic plan views illustrating the detector according to the first embodiment.

Figure 15:
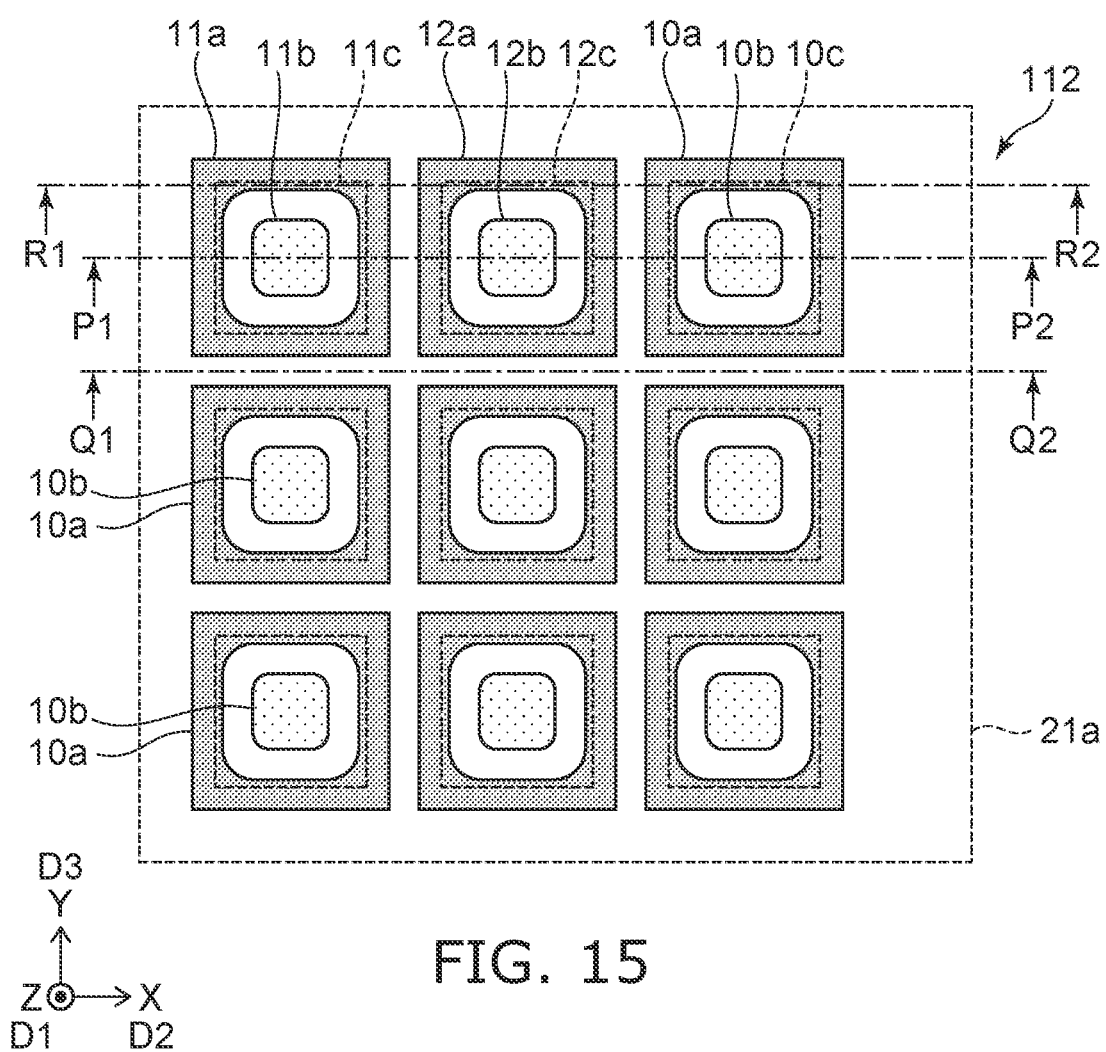
FIG. 15 is a schematic plan view illustrating the detector according to the first embodiment.
Figure 16:
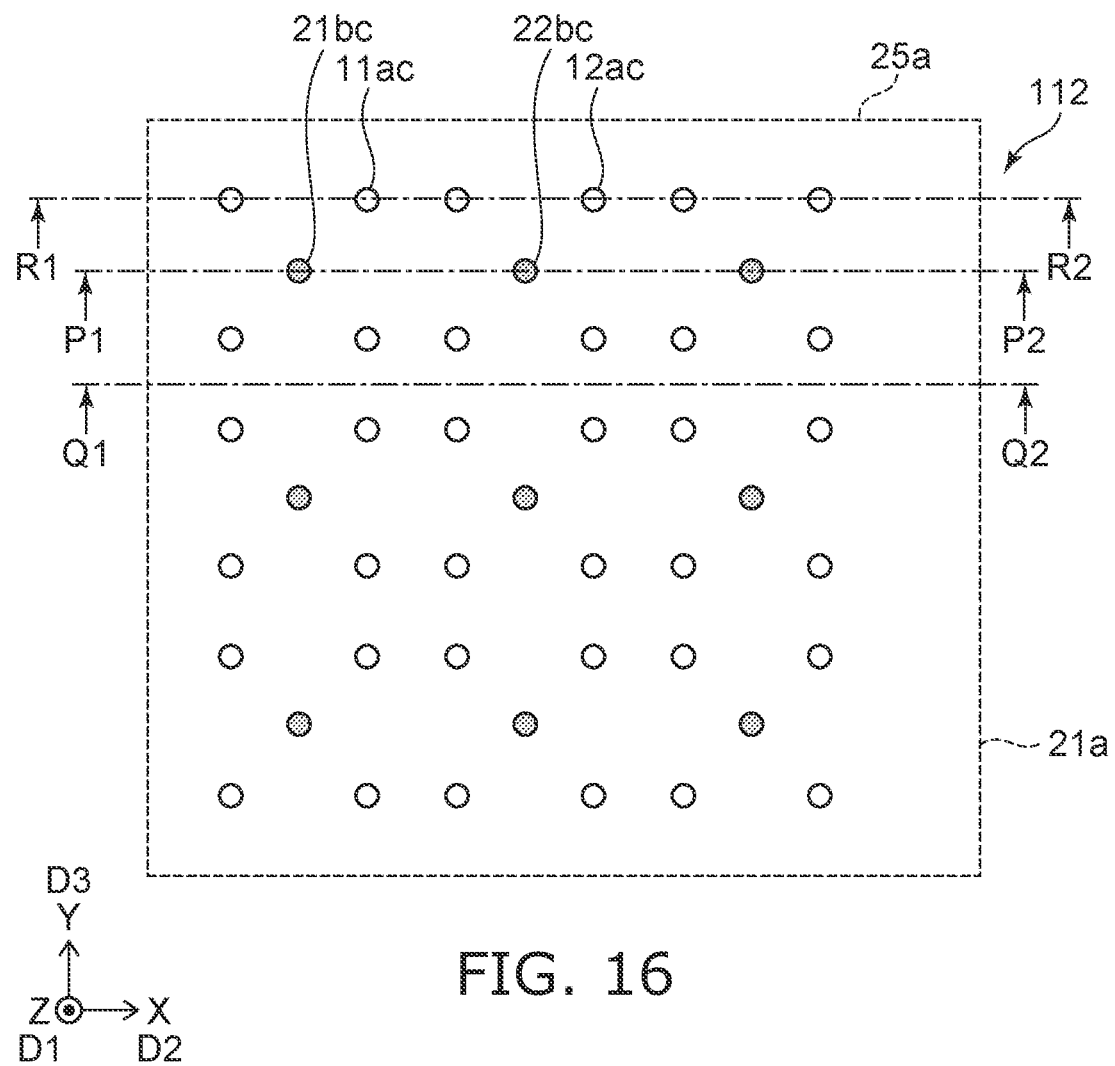
FIG. 16 is a schematic plan view illustrating the detector according to the first embodiment.
Figure 17:
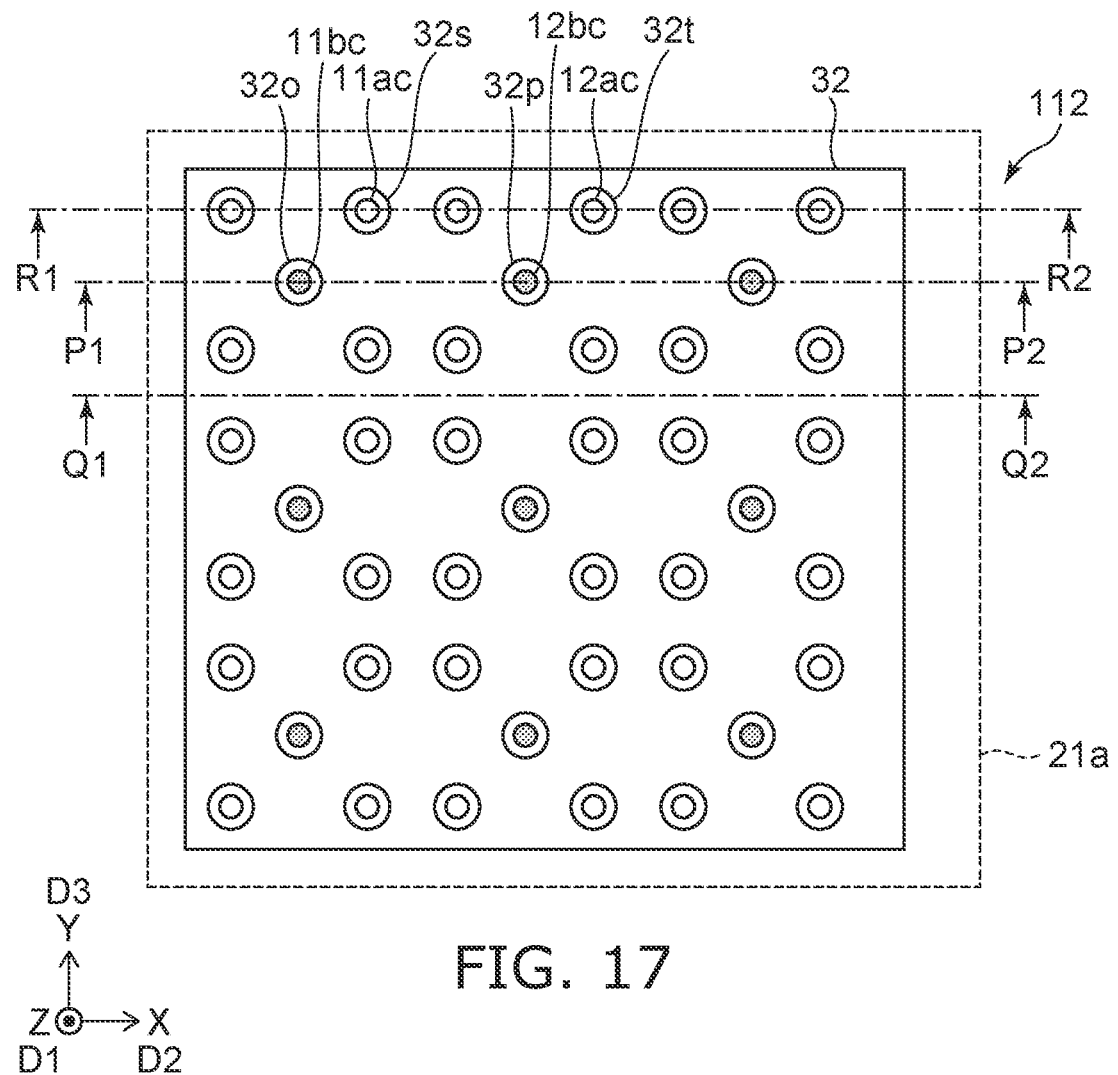
FIG. 17 is a schematic plan view illustrating the detector according to the first embodiment.
Figure 18:
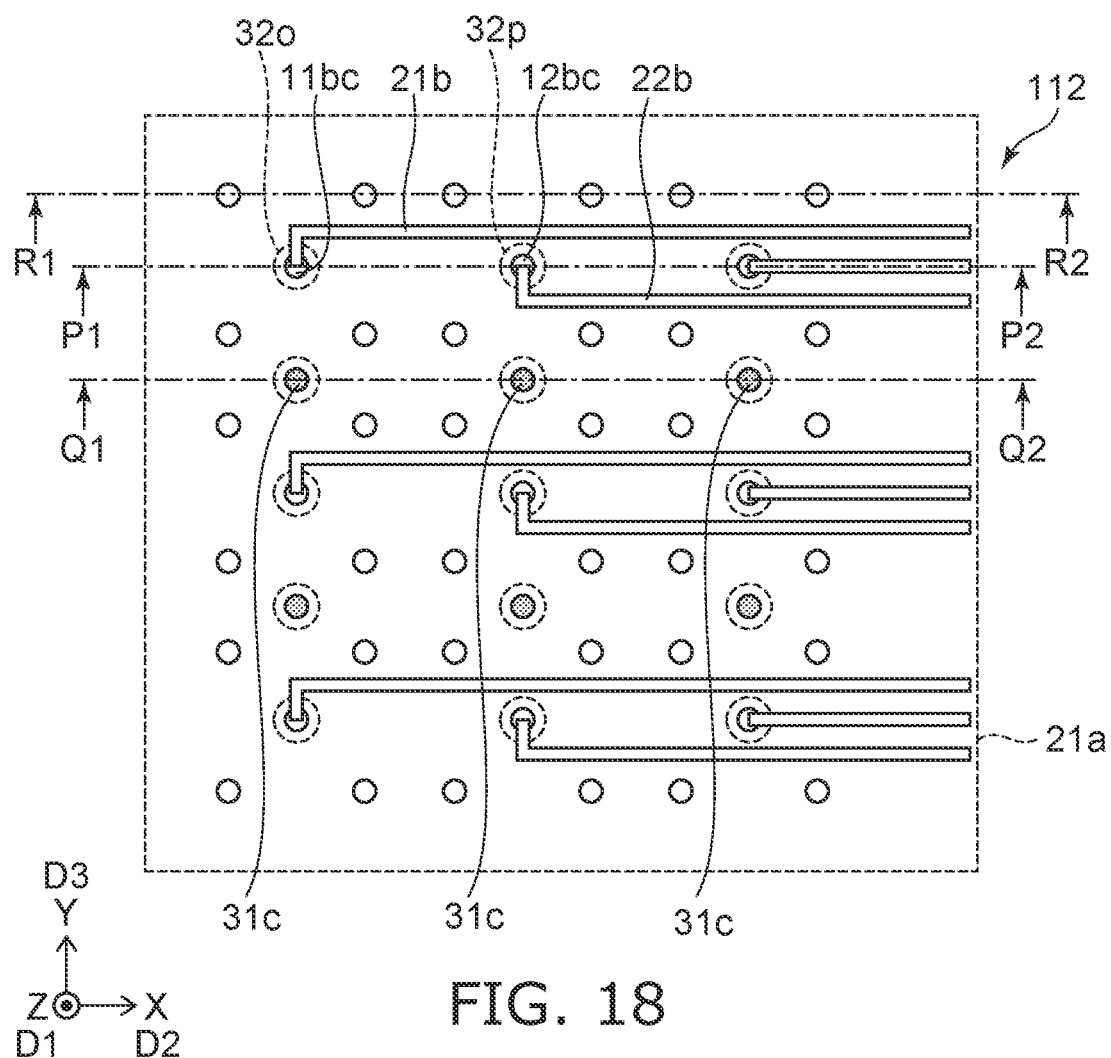
FIG. 18 is a schematic plan view illustrating the detector according to the first embodiment.
Figure 19:
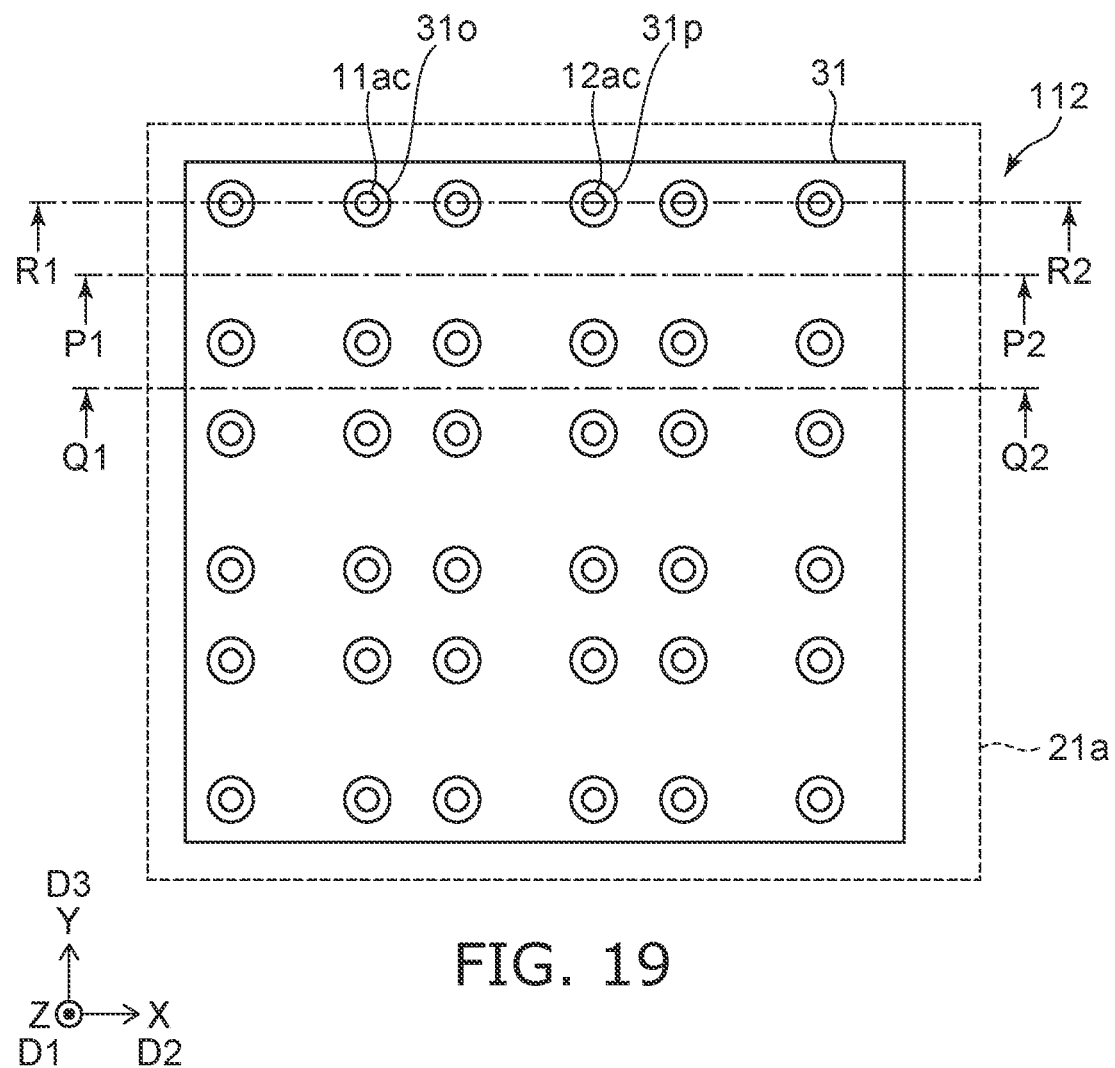
FIG. 19 is a schematic plan view illustrating the detector according to the first embodiment.
Figure 20:
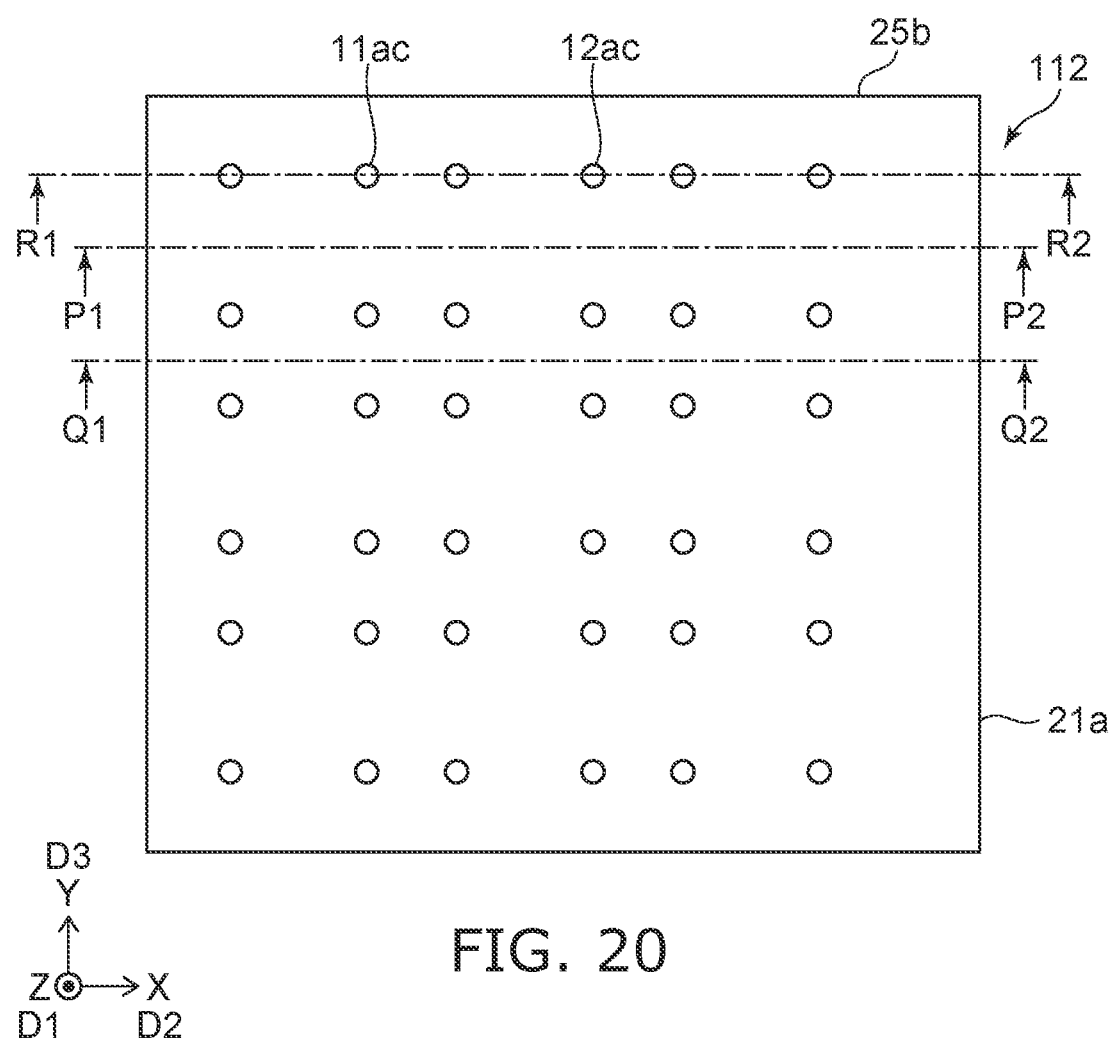
FIG. 20 is a schematic plan view illustrating the detector according to the first embodiment.
Figure 21:
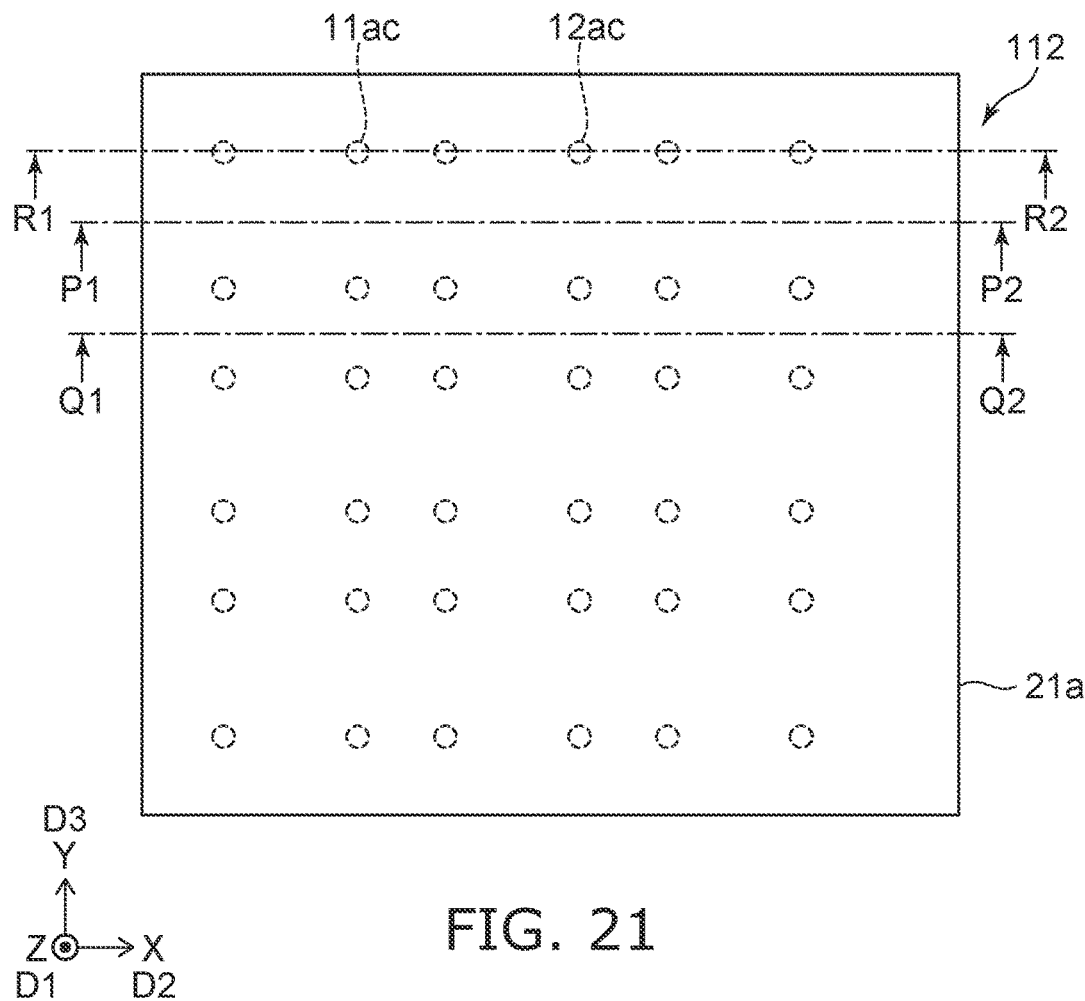
FIG. 21 is a schematic plan view illustrating the detector according to the first embodiment.

FIG. 12A is a sectional view taken along the line P1-P2 of FIGS. 13 to 21. FIG. 12B is a cross-sectional view taken along the line Q1-Q2 of FIGS. 13 to 21. FIG. 12C is a cross-sectional view taken along the line R1-R2 of FIGS. 13 to 21. As shown in FIG. 12A, the insulating member 25 includes a first insulating region 25a and a second insulating region 25b. At least a part of the first insulating region 25a is located between the second conductive layer 32 and the first detection portion 11D in the first direction D1. At least a part of the second insulating region 25b is located between the first electrode layer 21a and the first conductive layer 31 in the first direction D1. FIG. 16 illustrates the first insulating region 25a. FIG. 20 illustrates the second insulating region 25b.

As shown in FIGS. 12A and 12B, in a detector 112 according to the embodiment, the first counter electrode 11b is provided between a part of the first electrode 11a and another part of the first electrode 11a in the direction crossing the first direction D1. Except for this, the configuration of the detector 112 may be the same as the configuration of the detector 110. Noise can also be suppressed in the detector 112. Stable detection is facilitated. As shown in FIG. 15, in this example, the first electrode 11a is annular. In the detector 112, the controller 70 may be provided.

As shown in FIG. 12C, the first electrode connecting portion 11ac passes through the first conductive layer hole 310 of the first conductive layer 31 along the first direction D1. The first electrode connecting portion 11ac passes through the second conductive layer hole 32s of the second conductive layer 32 along the first direction D1. The second electrode connecting portion 12ac passes through the first conductive layer hole 31p of the first conductive layer 31 along the first direction D1. The second electrode connecting portion 12ac passes through the second conductive layer hole 32t of the second conductive layer 32 along the first direction D1.

In the detectors 111 and 112, the element portion 10U may include the base body 25s. At least a part of the base body 25s is provided between the first detection portion 11D and the first scintillator 41.

Second Embodiment

Figure 22:
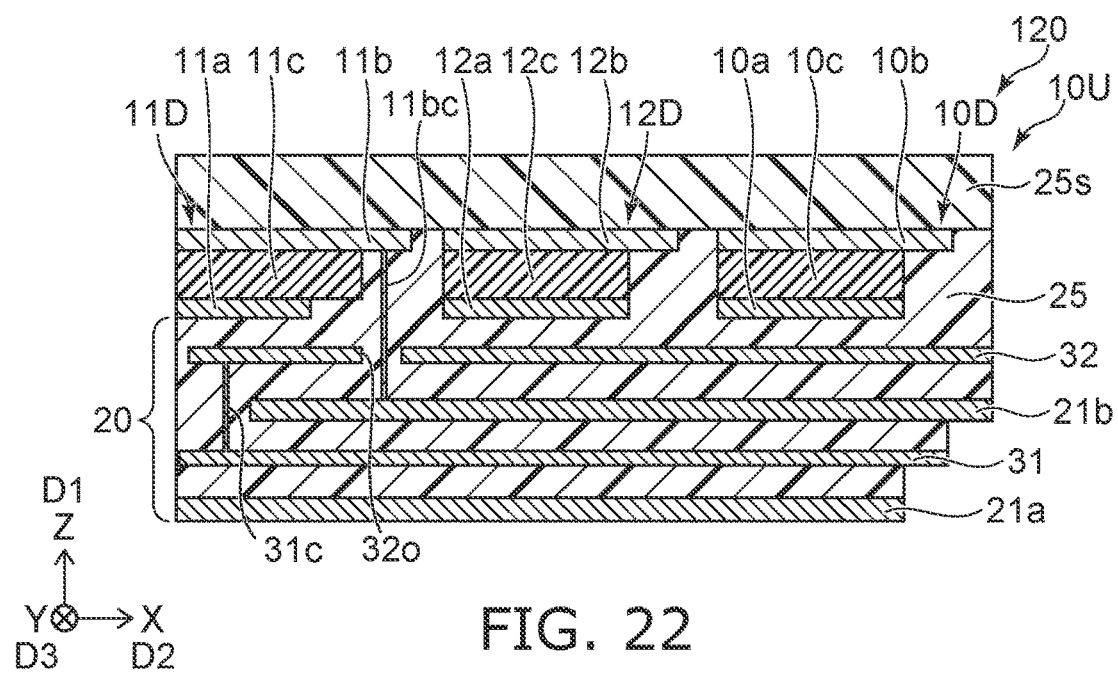
FIG. 22 is a schematic cross-sectional view illustrating a detector according to the second embodiment.
Figure 23:
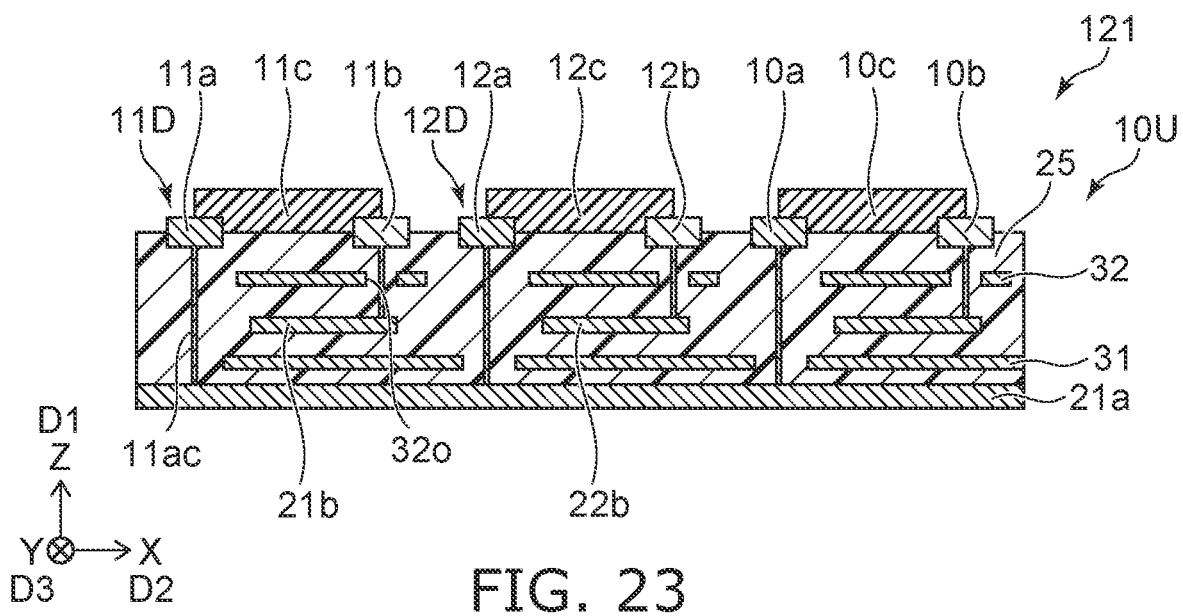
FIG. 23 is a schematic cross-sectional view illustrating the detector according to the second embodiment.
Figure 24:
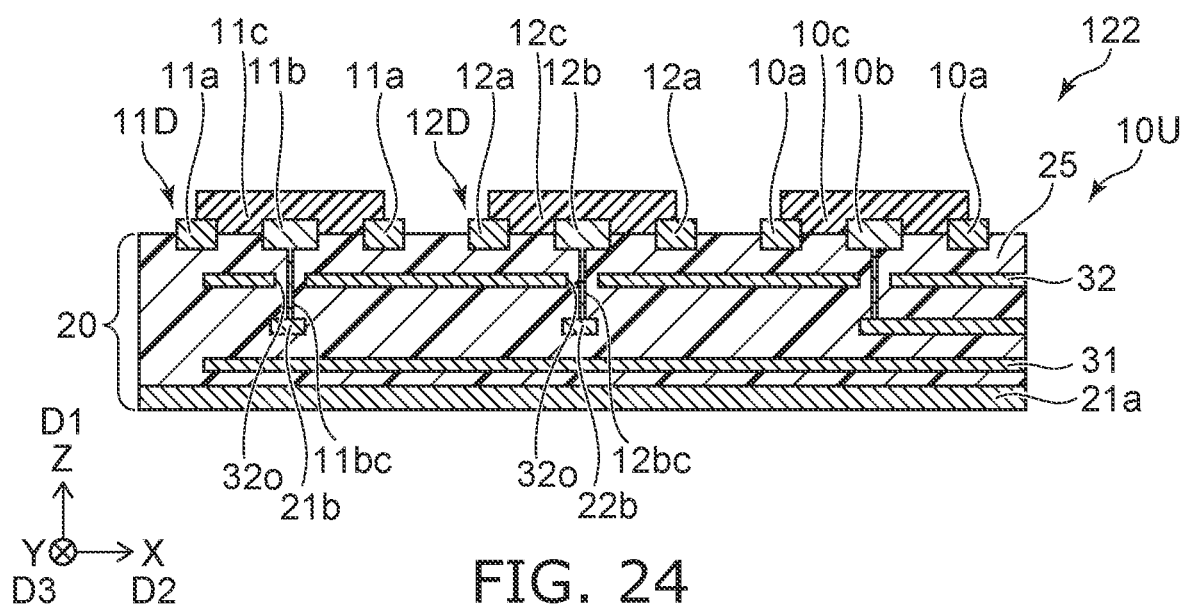
FIG. 24 is a schematic cross-sectional view illustrating the detector according to the second embodiment.

FIGS. 22 to 24 are schematic cross-sectional views illustrating a detector according to the second embodiment.

As shown in FIGS. 22 to 24, in detectors 120 to 122 according to the embodiment, the scintillator 40 (first scintillator 41, second scintillator 42, etc.) is omitted. Except for this, the configurations of the detectors 120 to 122 may be the same as the configurations of the detectors 110 to 112. The detection target wave 81 may be light.

In the embodiment, the first organic semiconductor layer 11c includes, for example, a p-type region and an n-type region. The p-type region includes, for example, at least one of polythiophene and a derivative of polythiophene. The n-type region includes, for example, a fullerene derivative. In one example, the first organic semiconductor layer 11c includes, for example, Poly (3-hexylthiophene) and [6,6]-phenyl C61 butyric acid methyl ester. For example, the second organic semiconductor layer 12c includes the same material as the first organic semiconductor layer 11c.

The first scintillator 41 includes, for example, at least one selected from the group consisting of PVT (Polyvinyl toluene), PVK (Polyvinylcarbazole), and PMMA (Polymethyl methacrylate). For example, the second scintillator 42 includes the same material as the first scintillator 41.

The base body 25s includes, for example, a resin. The resin includes, for example, at least one selected from the group consisting of PET (polyethylene terephthalate), PEN (polyethylene naphthalate), Polyimide, and PC (polycarbonate).

The insulating member 25 includes, for example, at least one selected from the group consisting of polyimide, liquid crystal polymer and fluororesin.

In the embodiment, the detection target wave 81 may be at least one of beta ray, gamma ray, neutron ray, and X-ray.

The embodiment may include the following configurations (for example, technical proposals).
(Configuration 1)
A detector, comprising:
an element portion including:
a first detection portion including a first electrode, a first counter electrode, and a first organic semiconductor layer, at least a part of the first organic semiconductor layer being between the first electrode and the first counter electrode, and
a wiring portion,
the wiring part including:
a first electrode layer electrically connected with the first electrode,
a first counter electrode layer electrically connected with the first counter electrode, and
a first conductive layer,
the first counter electrode layer being between the first electrode layer and the first detection portion in a first direction from the first electrode layer to the first counter electrode layer,
the first conductive layer being between the first electrode layer and the first counter electrode layer in the first direction.
(Configuration 2)
The detector according to Configuration 1, wherein the first conductive layer is electrically insulated from the first electrode layer and electrically insulated from the first counter electrode.
(Configuration 3)
The detector according to Configuration 1 or 2, further comprising a controller,
the controller being configured to set the first counter electrode layer to a first potential with reference to a potential of the first electrode layer,
the controller being configured to set the first conductive layer to a second potential with reference to the first electrode layer,
the second potential being the first potential, or the second potential being between the potential of the first electrode layer and the first potential.
(Configuration 4)
The detector according to Configuration 3, wherein the controller includes a first circuit configured to set the first counter electrode layer to the first potential, and a second circuit configured to the first conductive layer to the second potential.

(Configuration 5)

The detector according to Configuration 3 or 4, wherein the first potential and the second potential are negative.

(Configuration 6)

The detector according to any one of Configurations 1-5, wherein the wiring portion further includes a second conductive layer electrically connected with the first conductive layer, and in the first direction, at least a part of the second conductive layer is provided between at least a part of the first counter electrode layer and the first detection portion.

(Configuration 7)

The detector according to Configuration 6, wherein the wiring portion includes a first counter electrode connecting portion, the second conductive layer includes a second conductive layer hole, the first counter electrode connecting portion passes through the second conductive layer hole in the first direction, and the first counter electrode connecting portion electrically connects the first counter electrode with the first counter electrode layer.

(Configuration 8)

The detector according to Configuration 6 or 7, wherein the wiring portion includes a first conductive layer connecting portion, and the first conductive layer connecting portion electrically connects the second conductive layer with the first conductive layer.

(Configuration 9)

The detector according to any one of Configurations 1-8, wherein the wiring portion includes a first electrode connecting portion, the first conductive layer includes a first conductive layer hole, the first electrode connecting portion passes through the first conductive layer hole in the first direction, and the first electrode connecting portion electrically connects the first electrode with the first electrode layer.

(Configuration 10)

The detector according to any one of Configurations 1-9, wherein the wiring portion further includes an insulating member, at least a part of the insulating member is provided:

between the first electrode layer and the first conductive layer, between the first conductive layer and the first counter electrode layer, and between the first counter electrode layer and the element portion.

(Configuration 11)

The detector according to any one of Configurations 1-10, wherein the element portion further includes a second detection portion, the second detection portion includes a second electrode, a second counter electrode, and a second organic semiconductor layer, at least a part of the second organic semiconductor layer is provided between the second electrode and the second counter electrode, the wiring portion further includes a second counter electrode layer electrically connected with the second counter electrode, the second electrode is electrically connected with the first electrode layer, in the first direction, a part of the first conductive layer is provided between the first electrode layer and the second counter electrode layer, and in the first direction, the second counter electrode layer is provided between the part of the first conductive layer and the second detection portion.

(Configuration 12)

The detector according to Configuration 11, wherein the first counter electrode layer extends along a second direction crossing the first direction, the second counter electrode layer extends along the second direction, and a direction from the second counter electrode layer to the first counter electrode layer is along a third direction crossing a plane including the first direction and the second direction.

(Configuration 13)

The detector according to any one of Configurations 1-12, wherein an area of the first conductive layer in a plane perpendicular to the first direction is larger than an area of the first counter electrode layer in the plane perpendicular to the first direction.

(Configuration 14)

The detector according to any one of Configurations 1-13, wherein the first electrode is provided between the wiring portion and the first counter electrode in the first direction.

(Configuration 15)

The detector according to Configuration 14, wherein the first electrode is provided between the first conductive layer and the first counter electrode in the first direction.

(Configuration 16)

The detector according to Configuration 14 or 15, wherein a light transmittance of the first counter electrode is higher than a light transmittance of the first electrode.

(Configuration 17)

The detector according to any one of Configurations 1-13, wherein a direction from the first electrode to the first counter electrode crosses the first direction.

(Configuration 18)

The detector according to any one of Configurations 1-13, wherein the first counter electrode is provided between a part of the first electrode and another part of the first electrode in a direction crossing the first direction.

(Configuration 19)

The detector according to any one of Configurations 1-18, wherein the element portion further includes a first scintillator, and the first detection portion is provided between the wiring portion and the first scintillator.

(Configuration 20)

The detector according to Configuration 19, wherein the element portion further includes a base body, and at least a portion of the base body is provided between the first detector and the first scintillator.

According to the embodiment, it is possible to provide a detector capable of stable detection.

In the specification of the present application, the "electrically connected state" includes a state in which a plurality of conductors are physically in contact with each other and a current flows between the plurality of conductors. The "electrically connected state" includes a state in which another conductor is inserted between the plurality of conductors and a current flows between the plurality of conductors.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in detectors such as electrodes, conductive layers, organic semiconductor layers, scintillator layers, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all detectors practicable by an appropriate design modification by one skilled in the art based on the detectors described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A detector, comprising:
an element portion including:
a first detection portion including a first electrode, a first counter electrode, and a first organic semiconductor layer, at least a part of the first organic semiconductor layer being between the first electrode and the first counter electrode, and
a wiring portion,
the wiring portion including:
a first electrode layer electrically connected with the first electrode,
a first counter electrode layer electrically connected with the first counter electrode, and
a first conductive layer,
the first counter electrode layer being between the first electrode layer and the first detection portion in a first direction from the first electrode layer to the first detection portion, and
the first conductive layer being between the first electrode layer and the first counter electrode layer in the first direction.

2. The detector according to claim 1, wherein the first conductive layer is electrically insulated from the first electrode layer and electrically insulated from the first counter electrode.

3. The detector according to claim 1, further comprising a controller,
the controller being configured to set the first counter electrode layer to a first potential with reference to a potential of the first electrode layer,
the controller being configured to set the first conductive layer to a second potential with reference to the first electrode layer, and
the second potential being the first potential, or the second potential being between the potential of the first electrode layer and the first potential.

4. The detector according to claim 3, wherein the controller includes
a first circuit configured to set the first counter electrode layer to the first potential, and
a second circuit configured to the first conductive layer to the second potential.

5. The detector according to claim 3, wherein the first potential and the second potential are negative.

6. The detector according to claim 1, wherein
the wiring portion further includes a second conductive layer electrically connected with the first conductive layer, and
in the first direction, at least a part of the second conductive layer is provided between at least a part of the first counter electrode layer and the first detection portion.

7. The detector according to claim 6, wherein
the wiring portion includes a first counter electrode connecting portion,
the second conductive layer includes a second conductive layer hole,
the first counter electrode connecting portion passes through the second conductive layer hole in the first direction, and
the first counter electrode connecting portion electrically connects the first counter electrode with the first counter electrode layer.

8. The detector according to claim 6, wherein
the wiring portion includes a first conductive layer connecting portion, and
the first conductive layer connecting portion electrically connects the second conductive layer with the first conductive layer.

9. The detector according to claim 1, wherein
the wiring portion includes a first electrode connecting portion,
the first conductive layer includes a first conductive layer hole,
the first electrode connecting portion passes through the first conductive layer hole in the first direction, and
the first electrode connecting portion electrically connects the first electrode with the first electrode layer.

10. The detector according to claim 1, wherein
the wiring portion further includes an insulating member,
at least a part of the insulating member is provided:
between the first electrode layer and the first conductive layer,
between the first electrode layer and the first counter electrode layer, and
between the first counter electrode layer and the element portion.

11. The detector according to claim 1, wherein the element portion further includes a second detection portion, the second detection portion includes a second electrode, a second counter electrode, and a second organic semiconductor layer, at least a part of the second organic semiconductor layer is provided between the second electrode and the second counter electrode, the wiring portion further includes a second counter electrode layer electrically connected with the second counter electrode, the second electrode is electrically connected with the first electrode layer, in the first direction, a part of the first conductive layer is provided between the first electrode layer and the second counter electrode layer, and in the first direction, the second counter electrode layer is provided between the part of the first conductive layer and the second detection portion.

12. The detector according to claim 11, wherein the first counter electrode layer extends along a second direction crossing the first direction, the second counter electrode layer extends along the second direction, and a direction from the second counter electrode layer to the first counter electrode layer is along a third direction crossing a plane including the first direction and the second direction.

13. The detector according to claim 1, wherein an area of the first conductive layer in a plane perpendicular to the first direction is larger than an area of the first counter electrode layer in the plane perpendicular to the first direction.

14. The detector according to claim 1, wherein the first electrode is provided between the wiring portion and the first counter electrode in the first direction.

15. The detector according to claim 14, wherein the first electrode is provided between the first conductive layer and the first counter electrode in the first direction.

16. The detector according to claim 1, wherein the first electrode is provided between the first conductive layer and the first counter electrode in the first direction.

17. The detector according to claim 1, wherein a direction from the first electrode to the first counter electrode crosses the first direction.

18. The detector according to claim 1, wherein the first counter electrode is provided between a part of the first electrode and another part of the first electrode in a direction crossing the first direction.

19. The detector according to claim 1, wherein the element portion further includes a first scintillator, and the first detection portion is provided between the wiring portion and the first scintillator.

20. The detector according to claim 19, wherein the element portion further includes a base body, and at least a portion of the base body is provided between the first detection portion and the first scintillator.

* * * * *